United States Patent [19]
Oishi et al.

[11] Patent Number: 5,441,010
[45] Date of Patent: Aug. 15, 1995

[54] EVAPORATION MATERIAL AND METHOD OF PREPARING THE SAME

[75] Inventors: Yukihiro Oishi; Susumu Yamamoto; Teruyuki Murai; Nozomu Kawabe, all of Itami, Japan

[73] Assignee: Sumitomo Electric Industries, Ltd., Osaka, Japan

[21] Appl. No.: 178,277

[22] PCT Filed: May 6, 1994

[86] PCT No.: PCT/JP93/00594
§ 371 Date: Jan. 4, 1994
§ 102(e) Date: Jan. 4, 1994

[87] PCT Pub. No.: WO93/23586
PCT Pub. Date: Nov. 25, 1993

[30] Foreign Application Priority Data

| May 11, 1992 | [JP] | Japan | 4-146502 |
| May 11, 1992 | [JP] | Japan | 4-146503 |
| May 11, 1992 | [JP] | Japan | 4-146504 |
| Sep. 30, 1992 | [JP] | Japan | 4-286677 |
| Nov. 13, 1992 | [JP] | Japan | 4-328526 |
| Apr. 2, 1993 | [JP] | Japan | 5-100277 |
| Apr. 9, 1993 | [JP] | Japan | 5-107728 |
| Apr. 16, 1993 | [JP] | Japan | 5-113749 |

[51] Int. Cl.$^6$ ............................ C30B 29/00
[52] U.S. Cl. ................... 117/40; 117/900; 427/422; 427/456
[58] Field of Search ........... 117/40, 900; 148/24; 219/145.22, 145.23; 427/422, 452, 453, 456

[56] References Cited

U.S. PATENT DOCUMENTS 3,091,022  5/1963  Faulkner ........................ 428/558

FOREIGN PATENT DOCUMENTS

| 50-23367 | 3/1975 | Japan . |
| 59-45327 | 3/1984 | Japan . |
| 59-64734 | 4/1984 | Japan . |
| 60-46355 | 3/1985 | Japan . |
| 60-50625 | 3/1985 | Japan . |
| 61-32219 | 2/1986 | Japan . |
| 61-94238 | 5/1986 | Japan . |
| 61-160836 | 7/1986 | Japan . |
| 61-246918 | 11/1986 | Japan . |
| 62-295219 | 12/1987 | Japan . |
| 64-(1)75144 | 3/1989 | Japan . |
| 2-137126 | 5/1990 | Japan . |
| 2-147195 | 6/1990 | Japan . |
| 3-236435 | 10/1991 | Japan . |
| 1517907 | 7/1978 | United Kingdom . |

*Primary Examiner*—Olik Chaudhuri
*Assistant Examiner*—Felica Garrett
*Attorney, Agent, or Firm*—W. G. Fasse; W. F. Fasse

[57] ABSTRACT

An evaporation material is used in manufacturing a VTR tape, a vertical magnetic recording thin film or the like. The evaporation material is a wire comprising a cobalt metal, a cobalt nickel alloy containing not more than 30 weight % of nickel, or a cobalt-chromium alloy containing not more than 30 weight % of chromium. This wire has a diameter of at least 1.0, mm and not more than 10 mm, a tensile strength of at least 400 MPa and not more than 1500 MPa, and a elongation and a reduction of area of at least 5%. The evaporation material has a prescribed crystal structure, with a face centered cubic lattice ratio of at least 0.1 and not more than 1.

7 Claims, 21 Drawing Sheets

EVAPORATION MATERIAL AND METHOD OF PREPARING THE SAME

FIELD OF THE INVENTION

The present invention relates to an evaporation material of a cobalt-nickel (Co—Ni) group alloy or a cobalt (Co) metal which is employed in a process of manufacturing an evaporated videotape or the like, or an evaporation material of a cobalt-chromium (Co—Cr) group alloy which is employed in a process of manufacturing a vertical magnetic recording thin film or the like, and a method of preparing the same.

BACKGROUND OF THE INVENTION

Recently, recording of higher picture quality and higher tone quality is required for a videotape. In order to cope with this, a tape is now being employed on which is evaporated a Co metal or a Co—Ni alloy capable of recording and having higher magnetic density as compared with a conventional tape coated with ferrite or a metal. The Co metal or the Co—Ni alloy is excellent in magnetic properties, i.e., coercive force and residual magnetic flux density. Therefore, recording of high picture quality and high tone quality is enabled by improving the magnetic density in a tape on which a Co metal or a Co—Ni alloy is evaporated. Further, future demand increase is expected for such an evaporated tape in relation to long-time recording, application to high-definition broadcasting and the like.

With reference to FIG. 2, an evaporation step for such a tape is described. FIG. 2 is a schematic diagram showing an evaporation unit A delivery shaft 13, a take-up shaft 14, a crucible 16, an electron gun 17 and a feeder 18 are arranged in the interior of a vacuum chamber 11. The delivery shaft 13 delivers a base film (polyester film, for example) 12, and the take-up shaft 14 takes up the evaporated base film 12. The crucible 16 stores an evaporation material 15. The evaporation material 15 is heated, melted and vaporized by an electron beam which is emitted from the electron gun 17. The evaporation material 15 is fed from the feeder 18 to the crucible 16. In such a unit, the interior of the vacuum chamber 11 is held in a vacuum state of about $10^{-5}$ to $10^{-6}$ Torr, and thereafter the evaporation material 15 is heated by the electron beam to a temperature of about 2000° C., to be melted and vaporized. The vaporized evaporation material 15 reaches an upper portion the base film 12. Thus, a thin film is formed on the base film 12 by evaporation.

A Co—Cr group alloy is also excellent in magnetic properties, i.e., coercive force and residual magnetic flux density. Therefore, the Co—Cr group alloy is employed as a material for a vertical magnetic recording thin film in recent years. This material is formed and employed as a vertical magnetic film by evaporation.

An evaporation method therefor is carried out in the interior of a vacuum chamber which is held in a vacuum state of about $10^{-5}$ to $10^{-6}$ Torr. An evaporation material stored in a crucible is heated by an electron beam to a temperature of about 2000° C., to be melted and vaporized. The vaporized material is made to reach a surface of a substrate, so that a thin film is formed on the surface of the substrate by evaporation.

It is necessary to refill the evaporation material of a Co metal, a Co—Ni alloy or a Co—Cr alloy for the vaporized part. Such refilling is carried out through a pellet member of about 10 mm$\phi$ by 10 to 30 mm in size or a bar member of 30 to 80 mm$\phi$. In general, a pellet member is dropped into a molten metal which is contained in a crucible, while a bar member is partially melted and dropped into a molten metal for refilling.

A method of manufacturing a pellet member is now described. First, a material such as a Co—Ni alloy is vacuum-fused, cast, hot-forged, and rolled to prepare a rolled wire. Then, this rolled wire is inserted in a hole of a die assembly as shown in FIG. 33, and a wire 9 which is projected from an opening portion of the hole is cut by shearing of a die A and another die B. Then, the as-obtained short member is subjected to barrel polishing and surface cleaning with an organic solvent, to obtain a pellet.

According to the aforementioned feeding method, however, evaporation conditions are instabilized following dropping of the pellet, to cause disturbance on a molten metal level of the evaporation material, scattering of the molten metal, non-uniformity of temperature distribution in the molten metal and the like. These instabilize the vaporization direction and the amount of vaporization of the material, and hence it has been impossible to manufacture an evaporated tape of stable quality.

On the other hand, it may be conceivable to feed an evaporation material by along wire, as a countermeasure for such a problem. It may be conceivable to continuously feed a long wire into a crucible to stabilize evaporation conditions, thereby manufacturing a highly reliable evaporated tape. In this case, a long-time continuous evaporating operation is advantageously enabled. Therefore, working of an evaporation material such as a Co—Ni alloy into a wire is desired. Among evaporation materials, that which is easy to elongate, such as aluminum (Al), is continuously fed by a wire in practice.

However, it is extremely difficult to wire-work a material such as a Co—Ni alloy. Namely, it is difficult to elongate such a material by cold working since the same is hard to work, and even if the same can be elongated by hot working, it is so difficult to completely round the wire surface that irregularity may be caused on the wire surface or the wire may be broken during feeding.

As shown in Japanese Patent Laying-Open No. 59-64734, further, there is a method of adding iron (Fe) into a Co—Ni alloy, thereby improving workability and toughness of the wire. In such a technique, however, there arises another problem such that excellent magnetic properties of the Co—Ni alloy are reduced. Namely, deterioration of excellent magnetic properties characterizing the Co—Ni group alloy is unavoidable since Fe is contained by 2 to 10 weight %.

As shown in Japanese Patent Laying-Open No. 3-236435, further, there is a technique of limiting impurities in an alloy, thereby improving toughness and the like. In this technique, however, only the alloy composition is studied and it is impossible to attain sufficient improvement of workability in drawing or the like merely by suppressing contents of oxygen, nitrogen and sulfur which are impurity elements.

On the other hand, two important points are present in a method of manufacturing a pellet member. One point is to reduce diametral deviation, and another point is to remove impurities (impurities, oxides etc. adhering in a previous step of hot forging, rolling or the like) from the surface. First, a problem caused by diametral deviation is described. Wile a rolled wire having large diametral deviation is cut in the aforementioned method of manufacturing a pellet, a sufficient clearance must be provided between the hole diameter of the die assembly and the diameter of the wire so that the wire passes through the hole of the die. When the rolled wire is cut in a state having large diametral deviation, the metal mold may be clogged with the wire. Further, the diametral deviation may be extremely increased or only a pellet member having a burr is obtained, leading to the problem that a feed pipe is clogged during feeding to an evaporation unit.

As to removal of surface impurities, on the other hand, it is impossible to sufficiently remove those deeply penetrating into the material, such as deposits in rolling, by the aforementioned barrel polishing and cleaning with an organic solvent. When impurities remain, the remaining impurities are vaporized with the evaporation material, and hence magnetic properties of the as-obtained tape are deteriorated. In order to further remove the impurities, therefore, it is necessary to carry out grinding with a lathe, or centerless grinding. However, cutting oil in a lathe or adhesion of new impurities such as abrasive grains in centerless grinding causes a problem, while the manufacturing cost is also increased. In such working, further, the material yield is reduced since the material itself is ground, leading to a subject of how to reduce grinding allowance.

When feeding by a pellet member is carried out, evaporation conditions are instabilized following dropping of the pellet, to cause problems of disturbance on a molten metal level of the evaporation material, scattering of the molten metal, non-uniformity in temperature distribution in the molten metal and the like. These instabilize the vaporization direction and the amount of vaporization of the material, to hinder quality stabilization in tape manufacturing.

In order to cope with such problems, it may be conceivable to work the evaporation material into a long wire and continuously feed the same into a crucible for stabilizing evaporation conditions, thereby manufacturing a highly reliable tape, as already described. In this case, a long-time continuous evaporating operation is also advantageously enabled, and hence working of a material such as a Co—Ni alloy into a wire has been desired.

Also in this case, however, minimization of the aforementioned diametral deviation and removal of surface impurities arise problems.

SUMMARY OF THE INVENTION

The present invention has been proposed under the aforementioned technical background, and an object thereof is to provide an evaporation material of a Co metal, a Co—Ni alloy or a Co—Cr alloy which is excellent in workability and toughness and a method of preparing the same, so that stable evaporation conditions can be obtained. Another object thereof is to provide a method of preparing the aforementioned evaporation material which contains a small amount of surface impurities and is excellent in shape homogeneity.

An evaporation material according to one aspect of the present invention is a wire, which is formed of one metal material selected from a group of a cobalt metal consisting of cobalt and unavoidable impurities, a cobalt-nickel alloy containing not more than 30 weight % of nickel with a rest consisting of unavoidable impurities, and a cobalt-chromium alloy containing not more than 30 weight % of chromium with a rest consisting of unavoidable impurities, having a wire diameter of at least 1.0 mm and not more than 10 mm and being provided with mechanical properties of tensile strength of at least 400 MPa and not more than 1500 MPa, elongation of at least 5% under a gauge length of 100 mm, and reduction of area of at least 5%.

In the aforementioned evaporation material, surface impurities are preferably removed by mechanical means such as surface grinding, or chemical means such as pickling.

The reasons why the respective properties of the inventive evaporation material are restricted as described above are now described.

As to the composition, first, no additional element is provided when a cobalt metal is employed as a simple substance, so as not to damage the excellent magnetic properties of cobalt (Co). Further, the content of nickel (Ni) is limited in a cobalt-nickel (Co—Ni) alloy and the content of chromium (Cr) is limited in a cobalt-chromium (Co—Cr) alloy, in consideration of the magnetic properties. Namely, an alloy containing Ni or Co in excess of 30 weight % in a Co alloy does not exhibit an excellent residual magnetic lux density for effectuating properties for serving as a magnetic tape or a magnetic recording thin film.

Next, the wire diameter is limited in consideration of operability (easiness in handling) and a feed rate etc. Namely, when the wire diameter exceeds 10 mm, the wire is hard to handle while the diameter of a take-up coil therefor is increased to exceed 1 m and a feeder itself is increased in size. This consequently leads to an increase in size of peripheral devices of the vacuum chamber, and a large space is required particularly when the feeder is provided in the vacuum chamber.

When the wire diameter is less than 1.0 mm, on the other hand, high-speed feeding is required in addition to such a problem that bending is easily caused, although the wire is easy to handle. As compared with a wire of 10 mm in diameter, for example, a feed rate of at least about 45 times is required, such that a speed of at least 100 m/min. is required in a quantity production type unit. As the result of such high-speed feeding, it is difficult to feed the evaporation material to a constant position in a crucible, leading to a problem such as disturbance of the molten metal level. Further, such a thin wire has a large specific surface area, while the amount of surface impurities per unit weight is increased. In addition, a length of at least 1000 times the diameter is required for a wire of the evaporation material, in order to carry out a continuous operation.

On the other hand, mechanical properties are also limited mainly in consideration of feedability and operability. Tensile strength of less than 400 MPa (about 40 kgf/mm$^2$) leads to inferior strength, while the wire is so hardened that the same is hard to feed when the tensile strength exceeds 1500 MPa (about 150 kgf/mm$^2$). When elongation or reduction of area is less than 5%, further, the wire is reduced in resistance against bending and causes breakage etc., leading to difficulty in feeding of the wire as the result. More desirably, both elongation and reduction of area are at least 10%.

In such an evaporation material, further, it is possible to form an evaporation film of higher quality by removing surface impurities through mechanical or chemical means. In this case, the surface impurities can be further effectively removed when cleaning with an organic solvent or a neutral detergent is carried out at need.

Preferably, the aforementioned evaporation material has a crystal structure satisfying a formula of $0.1 \leq f1/(f1+h1+h2) \leq 1$ at room temperature assuming that f1, h1 and h2 represent diffraction peak intensity values of a (200) plane of face centered cubic lattice (fcc), a (100) plane of a close-packed hexagonal lattice (hcp) and a (101) plane of the close-packed hexagonal lattice (hcp) respectively in a result of X-ray diffraction.

The evaporation material can have the workability required for working into a wire and attain mechanical properties (tensile strength: at least 400 MPa, reduction of area: at least 5%) suitable for continuous feeding, when the same is provided with the aforementioned crystal structure.

More preferably, the evaporation material is a wire of one material which is selected from a group of a cobalt (Co) metal wire consisting of cobalt and unavoidable impurities, and a cobalt-nickel (Co—Ni) alloy wire containing not more than 30 weight % of nickel (Ni) with a rest consisting of unavoidable impurities, and contains at least 0.01 weight % and not, more than 0.1 weight % of an element selected from a group of manganese (Mn), chromium (Cr), magnesium (Mg), zirconium (Zr) and calcium (Ca). Preferably, the evaporations material is a cobalt-chromium (Co—Cr) alloy wire containing not more than 30 weight % of chromium (Cr) with a rest consisting of unavoidable impurities, and contains at least 0.01 weight % and not more than 0.1 weight % of an element selected from a group of manganese (Mn), magnesium (Mg), zirconium (Zr) and calcium (Ca).

Mn, Cr, Mg, Zr and Ca are elements which are effective for improving workability of the Co—Ni alloy or the Co metal. The amount of addition of these elements is extremely reduced to 0.01 to 0.1 weight %, so that original magnetic properties (coercive force and residual magnetic flux density) of the Co—Ni alloy or the Co metal are absolutely not damaged. Further, Mn, Mg, Zr and Ca are elements which are effective for improving workability of the Co—Cr alloy. The amount of addition of these elements is extremely reduced to 0.01 to 0.1 weight %, so that original magnetic properties (coercive force and residual magnetic flux density) of the Co—Cr alloy are absolutely not damaged. These effects are extremely remarkable as compared with an amount of addition (2 to 10 weight %) of Fe in the technique described in Japanese Patent Laying-Open No. 59-64734.

Sufficient workability cannot be attained if the content of the aforementioned element is less than 0.01 weight %, while improvement in workability is no longer desired but impurities are unnecessarily increased when the content exceeds 0.1 weight %. Considering both workability and purity, the content of the aforementioned additional element is preferably 0.02 to 0.05 weight %.

In the aforementioned evaporation material, further, it is preferable that surface roughness of the wire is not more than 50 μm, diametral deviation of the wire diameter is not more than 0.1 mm, and waviness of the wire along its longitudinal direction s not more than 0.2 mm per length of 1 mm.

The surface roughness etc. are limited in the wire as described above, on the bass of consideration of the degree of vacuum in the chamber in feeding of the wire. When the wire is provided in the exterior of the vacuum chamber, for example, the wire is fed into the crucible through a vacuum sealing mechanism by an O-ring or the like. In this case, the O-ring can be continuously in contact with the wire following the same when the surface roughness and the diametral deviation of the wire are small and its waviness is lose. When the surface roughness and the diametral deviation are large and the waviness is also large, on the other hand, the atmospheric air is easily entrained into the chamber. Thus, there arises such a problem that the degree of vacuum in the chamber which is required for evaporation is reduced. When the surface roughness etc. are limited in the aforementioned manner, on he other hand, such a problem can be solved.

Working for adjusting the surface roughness etc. within constant ranges is carried out by acid-cleaning the wire or performing mechanical grinding (plucking, for example) by peeling or the like. In order to form a high-quality evaporated film, it is necessary to remove impurities from the surface of the wire. It is possible to remove the impurities also by such peeling or acid cleaning. A further effect is attained when cleaning is carried out with an organic solvent or a neutral detergent at need.

When the inventive evaporation material is a cobalt-nickel alloy wire containing not more than 30 weight % of nickel with a rest consisting of unavoidable impurities, it is preferable that the forementioned ratio of X-ray diffraction peak strength: $f1/(f1+h1+h2)$ is at least 0.3, an oxygen content is not more than 0.004 weight % (40 ppm), and the crystal grain size is not more than 80 μm.

As hereinabove described, the evaporation material according to one aspect of the present invention is extremely excellent in toughness, and it is possible to work the material into a were for continuously feeding the same to an evaporation unit. Thus, it is possible to stabilize evaporation conditions for forming a highquality evaporated film, while enabling a long-time continuous operation. Effective use is expected in the field of manufacturing of a VTR tape, a vertical magnetic recording thin film or the like, for example.

A method of preparing an evaporation material according to another aspect of the present invention is a method of preparing a material which is a wire formed of one metal material selected from a group of a cobalt metal consisting of cobalt and unavoidable impurities, a cobalt-nickel alloy containing not more than 30 weight % of nickel with a rest consisting of unavoidable impurities, and a cobalt-chromium alloy containing not more than 30 weight % of chromium with rest consisting of unavoidable impurities, having a wire diameter of at least 1.0 mm and not more than 10 mm. The inventive preparation method comprises the following steps:

(a) A step of preparing a metal material forming a wire by fusion casting.

(b) A step of heating the aforementioned metal material to a temperature of at least Tu°C. and thereafter performing plastic working ion the metal material at a temperature of at least Td°C. and not more than (Tu+200)°C. with reduction in area of at least 10% in a single pass assuming that a transformation temperature from a close-packed hexagonal lattice to a face centered cubic lattice as a crystal structure of the metal material is Tu°C. in a temperature rise process and a transformation temperature from the face centered cubic lattice to the close-packed hexagonal lattice is Td°C. in a temperature reduction process, thereby obtaining a wire.

The aforementioned plastic working is performed in a cooling process, or under a state of holding the heated temperature. After the plastic working is performed, the wire is preferably cooled at a temperature reducing speed of at least 0.1° C./sec. Further, the plastic working is performed by swaging (forging), rolling or wire drawing.

In addition, the fusion casting may be performed in the atmosphere, while the same is preferably performed by vacuum fusion casting, in order to reduce impurities contained in the material deteriorating magnetic properties. The aforementioned plastic working may be performed after the material is subjected to hot forging and rolling after fusion casting. Namely, a prescribed metal material is fused and cast to prepare an ingot, as an example of the inventive preparation method. This ingot is hot-forged to prepare a bar, which in turn is further heated to thereafter obtain a rolled wire. Plastic working of the metal material subsequent to the rolling is performed in the aforementioned limited temperature range with prescribed reduction in area.

In the preparation method according to the present invention, a substantially 100 weight % Co metal, a Co—Ni alloy containing not more than 30 weight % of Ni, or a Co—Cr alloy containing not more than 30 weight % of Cr is employed as a raw material. The raw material is limited to a metal or an alloy of such a composition, since the respective metal materials exhibit excellent magnetic properties, i.e., excellent values of coercive force and residual magnetic flux density.

FIG. 4 is a diagram showing phase transformation of a Co—Ni alloy. FIG. 5 is a diagram showing phase transformation of a Co—Cr alloy. Referring to FIG. 4, the Co—Ni alloy generally has an hcp structure (close-packed hexagonal lattice structure), and its crystal structure is transformed to an fcc (face centered cubic lattice) structure when the same is heated in excess of a transformation temperature Tu in a temperature rise process. The Co—Ni alloy once transformed into the fcc structure by heating maintains the crystal structure even if its temperature is reduced below the transformation temperature Tu, and is not transformed to the hcp structure until the temperature is reduced below the transformation temperature Td. Referring to FIG. 5, the crystal structure of the alloy material is transformed to an fcc structure also in the Co—Cr alloy, when the same is heated in excess of the transformation temperature Tu (=Td) in a temperature rise process. The material once transformed into the fcc structure by heating is not transformed to the hcp structure until its temperature is reduced below Td (=Tu).

In a Co—Ni alloy containing 20 weight % of Ni, for example, the transformation temperature Tu is 380° C., and Td is 200° C.

As hereinabove described, a material which is once transformed to an fcc structure maintains the crystal structure even if its temperature is reduced below Tu, and is not transformed to an hcp structure until the temperature is reduced below Td. Therefore, the material maintains a stable fcc structure even if the temperature is around Tu, and transformation from the fcc structure to an hcp structure is suppressed when plastic working with reduction in area of at least 10% is performed within a temperature range of at least Td and not more than Tu+200° C., whereby the material has a structure having a high ratio of the fcc structure at room temperature.

When plastic working is performed at a temperature of at least Tu+200° C. with reduction in area of not more than 10%, however, the material can easily be transformed from the fcc structure to ah hcp structure in temperature reduction. Therefore, workability after cooling is not excellent. Further, plastic working with reduction in area exceeding 30% is unpreferable since working distortion remains also after cooling. Further, a slow cooling rate of less than 0.1° C./sec. after the plastic working is not preferable since transformation from the fcc structure to an hcp structure is so facilitated that the as-obtained evaporation material does not exhibit excellent properties.

The above also applies to the substantially 100 weight % Co metal.

For the aforementioned reasons, it is possible to obtain a metal or an alloy having a high ratio of an fcc structure which has excellent cold workability according to the inventive preparation method, by performing plastic working on a Co metal, a Co—Ni alloy or a Co—Cr alloy under a limited temperature with limited reduction in area. Therefore, working such as cutting or wire drawing can be easily performed at room temperature. Thus, it is possible to easily work Co metal, a Co—Ni alloy or a Co—Cr alloy, which is generally regarded as being hard to work, into a wire, whereby this wire is extremely useful for stabilization of evaporation conditions, a long-time continuous operation and the like in manufacturing of a VTR tape, manufacturing of a magnetic recording thin film or the like when the same is employed as an evaporation material.

A method of preparing an evaporation material according to still another aspect of the present invention further comprises the following step, in addition to the aforementioned preparation steps (a) and (b):

(c) A step of reducing diametral deviation with respect to a diameter below 1/100 by wire drawing and performing shaving of at least 1/100 and not more than 5/100 of the diameter on the wire.

Preferably, the shaving is performed by drawing the wire with a perforated die for barking.

As an example of the forementioned inventive preparation method, a Co—Ni alloy is vacuum-fused, cast, hot-forged and rolled to prepare a rolled wire, which in turn is subjected to cold dr hot wire drawing (plastic working). Thus, diametral deviation is reduced to not more than 1/100 with respect to the diameter in the as-obtained wire. Thereafter shaving of at least 1/100 and not more than 5/100 of the diameter is performed in the state of a long wire.

The shaving is optimally performed by drawing with a perforated die for barking. When a perforated die or a roller die is employed for wire drawing and a perforated die for barking is employed for shaving so that these operations are continuously performed, a relation of D=d to 0.95 d is preferable assuming that represents the diameter of the die for wire drawing, and D represents the diameter of the perforated die for barking.

Further, when the wire obtained by such a method is inserted in a hole of a die and the part of the wire projected from an opening portion of this hole is cut by shearing to prepare a short evaporation material (pellet), the difference between the hole diameter of the die and the wire diameter is preferably made at least 0.05 mm and not more than 0.5 mm.

First, the aforementioned respective steps in the method of preparing a wire described. The fusion casting is preferably performed by vacuum fusion casting, in order to reduce impurities, contained in the material, deteriorating magnetic properties. Further, the wire drawing after the rolling is performed for reducing the diametral deviation of the rolled wire. The diametral deviation is so reduced as to reduce the amount of grinding in the shaving which is thereafter performed and to reliably remove the impurities. The impurities cannot be sufficiently removed if the amount of grinding is less than 1/100 of the wire diameter, while the amount of grinding is merely increased and the material yield is deteriorated when the amount exceeds 5/100.

When the shaving is performed by drawing with a barking die, it is possible to continuously grind a long wire and uniformalize the amount of grinding, whereby efficiency is so improved that the impurities can be reliably removed. In this case, stripes (the so-called chatters) which are perpendicular to the longitudinal direction are caused on the surface of the wire and the overall circumference cannot be clearly ground when the amount of grinding is less than 1/100 of the wire diameter, in addition to the aforementioned reasons. On the other hand, strength of the wire is made so insufficient that the same is easily broken if the amount exceeds 5/100.

Due to such working, a wire having an excellent surface state can be obtained. Particularly when the wire is fed from the exterior of a vacuum chamber through a vacuum sealing mechanism, therefore, no atmospheric air is entrained into the chamber by the sealing mechanism, and it is easy to maintain the degree of vacuum in the chamber.

Japanese Patent Laying-Open No. 50-23367 also shows a technique of removing an unnecessary portion from a surface of a long material with a shaving die for barking. However, the present invention is in consideration of surface cleaning of the wire and shape maintenance in cutting of a later step in a case of preparing a pellet on the basis of specific properties of the metal material such as the following Co—Ni alloy which is based on Co.

The specific properties are that the amount of plastic deformation is extremely small and that the amount of elastic deformation is extremely large in the Co—Ni alloy, for example. The amount of plastic deformation (the amount of deformation enabling wire drawing in this case) of this alloy is not more than about ½ in reduction in area in single wire drawing as compared with a general alloy of iron, steel, copper or Ni. Also in a plurality of times of wire drawing, the amount of plastic deformation of this alloy is not more than about 1/5 in reduction in area as compared with a general metal or alloy of iron or the like. On the other hand, the amount of elastic deformation (such an amount that a wire passing through a perforated die exceeds the hole diameter in wire drawing in this case) is at least three times as compared with a general metal or alloy of iron or the like.

When wire drawing is performed similarly to the aforementioned general metal, therefore, the wire is thickened and the amount of shaving is excessively increased after the wire drawing, to deteriorate the yield. In addition, a load in the wire drawing is so heavy that the wire is easily broken. Further, reduction in area in the wire drawing s small since the amount of plastic working is small, and hence the wire is further thickened after the wire drawing. Namely, this means that the wire is deformed in an elastic region to pass through the die. In order to cope With such specific properties, the shaving die diameter D is preferably set within the range of D=d to 0.95 d with respect to the wire drawing die diameter d, as to the de diameters in the wire drawing and the shaving following the same.

A method of preparing/a pellet member is now described. In general, diametral deviation is large since a rolled wire is cut as such and surface impurities are removed by barrel polishing, while the impurities cannot be sufficiently removed. According to the present invention, it is possible to obtain a long wire having small diametral deviation and containing a small amount of impurities by performing wire drawing and shaving after rolling. Thus, it is possible to reduce a clearance between a hole diameter of a die and a wire diameter in subsequent cutting employing the die, thereby obtaining a pellet member having small diametral deviation and an excellent shape. This clearance is too small if the same is less than 0.05 such that the wire is hard to feed, while diametral deviation on a cut surface is increased if the clearance exceeds 0.5.

As hereinabove described, it is possible to obtain a wire having an extremely small amount of surface impurities and small diametral deviation in accordance with the preparation method according to still another aspect of the present invention. When the wire is fed in the form of a long wire, therefore, it is possible to stabilize evaporation conditions which have generally caused problems to enable formation of a high-quality evaporated film, while enabling a long-time continuous operation. When the wire is fed from the exterior of an evaporation unit through a vacuum sealing mechanism, for example, the degree of vacuum in the chamber can be easily maintained.

Further, a material having a small amount of surface impurities and small diametral deviation can be obtained also in a short member. Particularly when a perforated die for barking is employed for shaving, the amount of grinding is homogeneous and productivity is high as compared with conventional barrel polishing, whereby the manufacturing cost can be reduced. Thus, when the evaporation material which is obtained by the inventive preparation method is employed, it is possible to manufacture a VTR tape or a magnetic recording thin film having higher quality.

DETAILED DESCRIPTION AND BEST MODE FOR CARRYING OUT THE INVENTION

EXAMPLE 1

Figure 1:
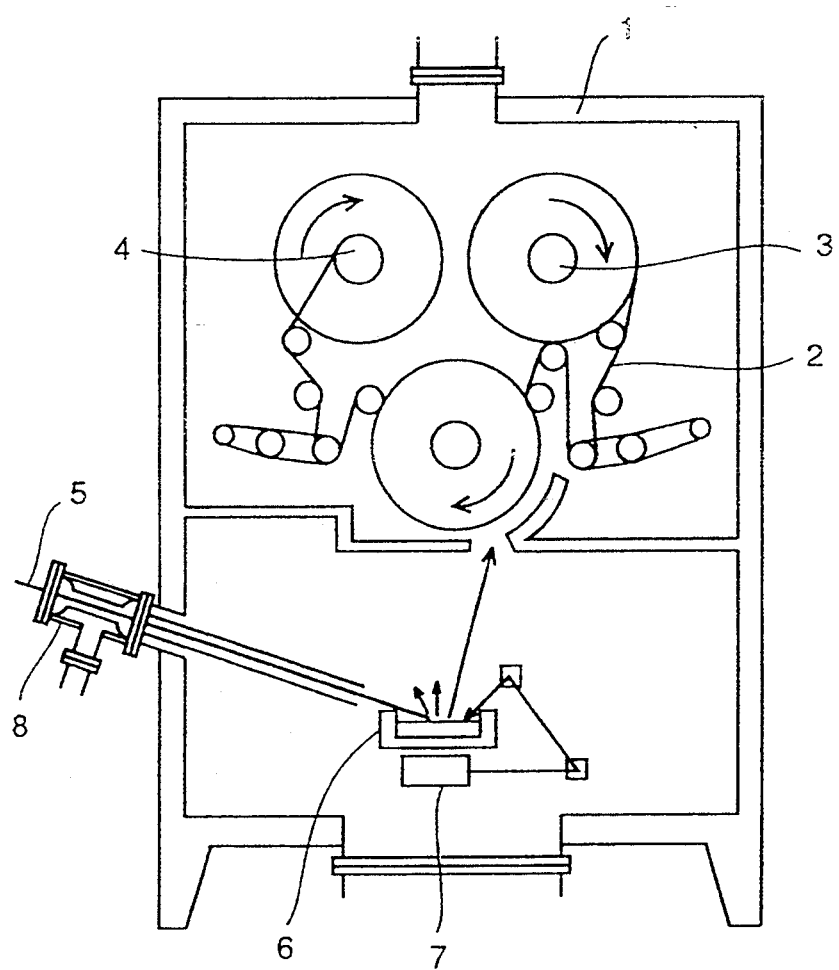
FIG. 1 is a schematic diagram of an evaporation unit showing a state of refilling an evaporation material according to the present invention.
Figure 2:
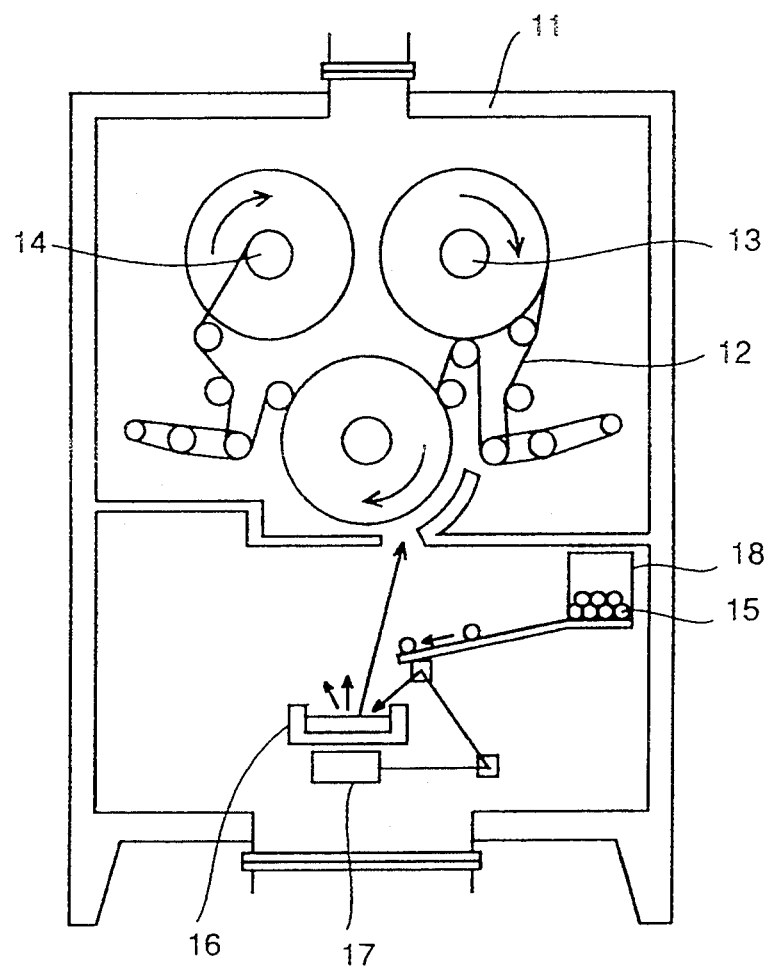
FIG. 2 is a schematic diagram of an evaporation unit showing a state of refilling an evaporation material by dropping of a pellet.

As shown in FIG. 1, an evaporation material 5 according to the present invention is employed in an evaporation unit which is substantially similar to that shown in FIG. 2. A delivery shaft 3 and a take-up shaft 4 for a base film 2, a crucible 6 for storing the evaporation material 5, and an electron gun 7 for heating, melting and vaporizing the evaporation material 5 with an electron beam are provided in the interior of a vacuum chamber 1 of 600 liters in volume. The evaporation unit shown in FIG. 1 is different from the evaporation unit shown in FIG. 2 in a method of refilling the evaporation material. Referring to FIG. 1, the linear evaporation material 5 is fed from the exterior of the vacuum camber 1 through a vacuum sealing mechanism 8 by an O-ring.

First, 80 weight % of Co and 20 weight % of Ni were fused in a vacuum of $10^{-5}$ Trr and forged to prepare an ingot of 100 kg. This ingot was hot-forged to prepare bars of about 70 mm$\phi$ by 3 m, which in turn were heated to a temperature of 1100° C., to thereafter obtain rolled wires of various sizes of 15 mm$\phi$ to 5.5 mm$\phi$.

(Wire Diameter)

These rolled wires were reduced in diameter by warm working or cold working within a temperature range of 400° to 600° C. and annealed at temperatures of not more than 1000° C. when work hardening was large. Wires of 15, 10, 8, 5, 3, 1.5 and 0.8 mm in diameter were prepared by such working, and subjected to a feeding test to the evaporation unit. The wire of 15 mm in diameter was extremely inferior in workability since the same was too thick, while the wire of 0.8 mm in diameter was problematic in workability such that the same was bent in an unexpected portion due to insufficient strength. The wires of 1.5 to 10 mm in diameter were excellent in points of strength and workability. Particularly the wires of 3 to 5 mm in diameter were proper in both of workability and a feed rate, and suitable for practical evaporating operations.

(Mechanical Properties)

Then, drafts and annealing were controlled to prepare wires of 30, 50, 80, 110, 150 and 170 kgf/mm² in material strength, in order to test mechanical properties. The evaporation unit shown in FIG. 1 was employed to similarly make a feeding test on these, whereby the wire having strength of 30 kgf/mm² caused problems such as breakage and wire breaking due to insufficient strength. Further, the wire having strength of 170 kgf/mm² was hard to handle since the same was too hard. On the other hand, the wires having strength levels of 50 to 150 kgf/mm² (about 500 to 1500 MPa), particularly the wires having strength levels of 70 to 100 kgf/mm² (about 700 to 1000 MPa) were easy to handle and excellent also in the point of feedability. As to reduction of area and elongation, it was confirmed that there occurred such problems that the wires were easily broken during feeding of the wires unless the values were at least 5% respectively.

(Surface Roughness)

Then, relations between surface roughness of the wires and degrees of vacuum were examined. As already described, a constant degree of vacuum must be maintained and entrainment of the atmospheric air from a sealing mechanism must be extremely small in order to fuse an evaporation material with an electron beam. Allowance for such entrainment is determined based on the displacement of a vacuum pump, a chamber volume and the like. Wires having different surface roughness levels were employed to perform a feeding test while setting basic conditions in wire feeding as vacuum pump displacement of 200 lit/sec., a wire feed rate of 5 m/min. and a wire diameter of 5.5 mm. The results are shown in the following:

| Surface Roughness ($\mu$m) | Degree of Vacuum (Torr) |
| --- | --- |
| 30 | $3 \times 10^{-6}$ |
| 50 | $2 \times 10^{-5}$ |
| 70 | $7 \times 10^{-5}$ |
| 90 | $1 \times 10^{-4}$ |

(waviness of wire: 0.05 mm/mm)

Thus, the surface roughness of the wire must be not more than 50 $\mu$m, in order to maintain a degree of vacuum of at least $5 \times 10^{-5}$ Torr, which allows fusion with an electron beam.

(Waviness)

Figure 3:
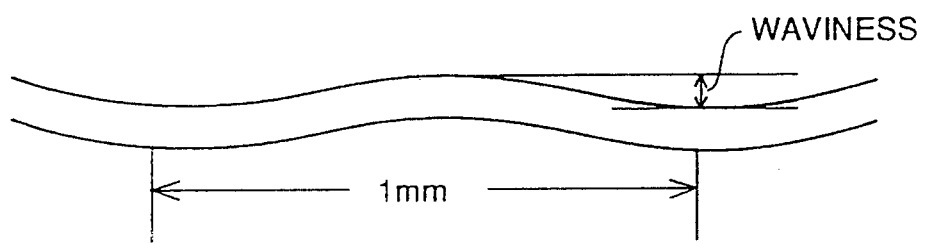
FIG. 3 is an explanatory diagram showing waviness of a wire.
Figure 4:
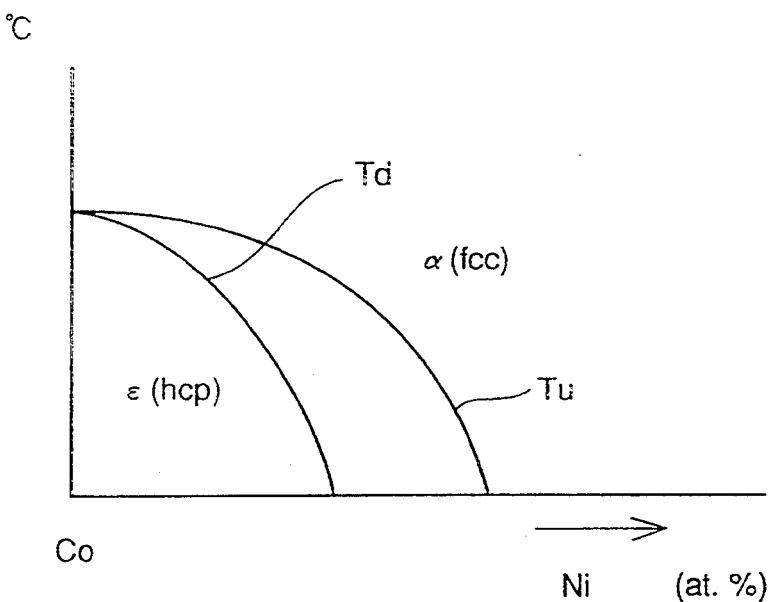
FIG. 4 is a diagram showing phase transformation in a Co—Ni alloy.
Figure 5:
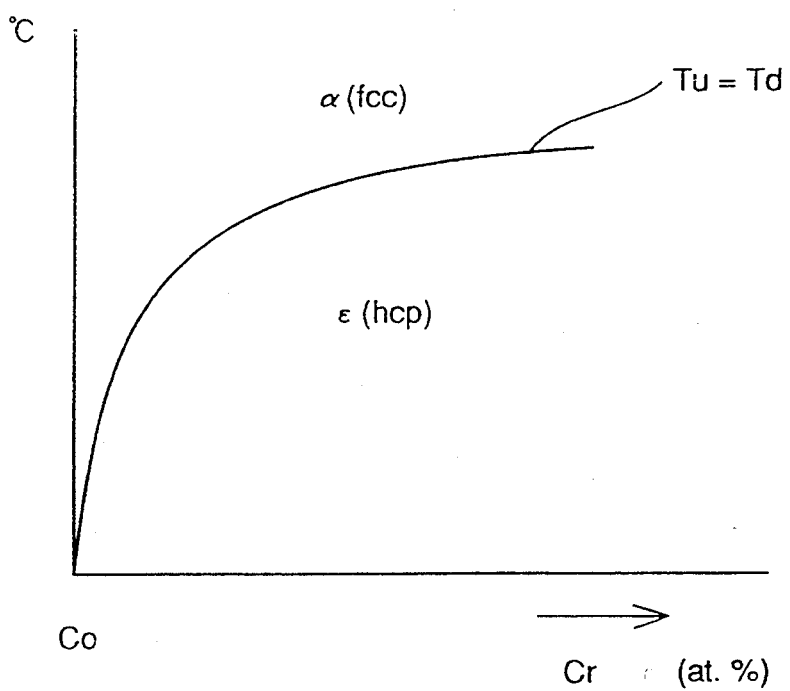
FIG. 5 is a diagram showing phase transformation of a Co—Cr alloy.

Further, relations between waviness of the wires and degrees of vacuum were examined similarly to the aforementioned case of surface roughness. The term waviness indicates a meandering state (amplitude) of each wire in a constant length. FIG. 3 shows waviness per length of 1 mm. In general, waviness is not very problematic in Al etc. in which an evaporation material is fed by a wire, since the wire itself is soft. However, a Co—Ni alloy (FIG. 4) is so hard that the atmospheric air may be entrained in the chamber depending on waviness, and such waviness of a wire arises a problem to be studied. The test results are shown below. The as-employed wires were 50 $\mu$m in surface roughness, and waviness is shown by values per 1 mm in length of the wires.

| Waviness (mm) | Degree of Vacuum (Torr) |
| --- | --- |
| 0.05 | $5 \times 10^{-6}$ |
| 0.08 | $5 \times 10^{-6}$ |
| 0.1 | $5 \times 10^{-6}$ |
| 0.12 | $7 \times 10^{-6}$ |
| 0.18 | $4 \times 10^{-5}$ |
| 0.2 | $5 \times 10^{-5}$ |
| 0.25 | $8 \times 10^{-5}$ |

Thus, waviness must be not more than 0.2 mm per 1 mm, in order to maintain the degree of vacuum. Further, wires of 0.1 mm and 0.2 mm in waviness and 5.5 mm in wire diameter were fed under conditions of wire feed rates of 1 to 10 m/min., whereby degrees of vacuum of $1 \times 10^{-5}$ Torr were maintained. When wire is of 0.3 mm in waviness were fed under the same conditions as the above, on the other hand, it was possible to maintain the degrees of vacuum of $1 \times 10^{-5}$ Torr only to wired rates of 1 to 2 m/min. at the maximum.

(Diametral Deviation)

Further, relations between diametral deviation of the wires and degrees of vacuum were also examined. Since it was difficult to arbitrarily select diametral deviation of the wires, diametral deviation values were measured when the degrees of vacuum were reduced. Basic conditions in feeding of the wires are similar to those of the aforementioned surface roughness test. The test results are shown below.

| Diametral Deviation (mm) | Surface Roughness ($\mu$m) | Degree of Vacuum (Torr) | Evaluation |
| --- | --- | --- | --- |
| 0.8 | 70 | $6 \times 10^{-5}$ | X |
| 0.2 | 30 | $7 \times 10^{-5}$ | X |
| 0.3 | 40 | $9 \times 10^{-5}$ | X |
| 0.1 | 50 | $5 \times 10^{-5}$ | o |

Thus, the wire must be not more than 0.1 mm in diametral deviation and not more than 50 $\mu$m in surface roughness.

(Surface Impurities)

Further, the degree of residue of surface impurities adhering in working into a wire was examined. A rolled wire of 10.6 mm$\phi$ was wire-drawn with a perforated die for barking and peeled to analyze residual surface impurities with a scanning electron microscope (SEM). As the result, all impurities adhering in rolling had been removed. However, a lubricant of Ca etc. was left. When this was steam-cleaned with an organic solvent, absolutely no impurities were recognized. On the other hand, no impurities were recognized in a wire-drawn wire which was peeled with a perforated die for barking and thereafter cleaned in a similar manner either.

EXAMPLE 2

While it has been described that elongation of a Co—Ni alloy is awaited, the following conditions are conceivably necessary in consideration of suitability as an evaporation material.

(1) Ni is not more than 30 weight % and the rest substantially consists of Co in alloy composition, in order to attain excellent magnetic properties.

(2) Impurities contained in the alloy material are extremely low levels. In particular, contamination of the material surface is reduced.

(3) Provided with strength and toughness allowing treatment for removing impurities (ideally shaving with a barking die or the like).

(4) The material must be in the form of a wire, coilable to facilitate operation, and be provided with toughness and strength allowing feeding from the coil.

In concrete terms, toughness and strength satisfying the aforementioned conditions are as follows:

(1) Allowing wire draining of about 10% in reduction in area in single working.

(2) Allowing shaving of about 0.2 mm in single working.

(3) Allowing coiling on a reel of about 300 mmφ in winding diameter and causing neither wire breaking nor breakage in delivery and feeding of the wire therefrom.

(Test Example)

On the premise of such conditions, various tests were carried out. First, relations between mechanical properties and workability of Co—Ni alloys were studied.

(Test Example 1)

(Relation between Mechanical Properties and Workability)

Respective raw materials of Co and Ni of at least 99.95% in purity were prepared to be 80:20 in weight ratio, and fused in a vacuum fusion furnace in a vacuum of about $10^{-4}$ Torr. The amount of fusion was about 50 kg, and the as-fused material was introduced into a mold of 150 mmφ in inner diameter, to prepare 10 charges of excellent cast materials of 150 mφ by 250 mm excluding dead head portions. These cast materials were heated to a temperature of 1150° C. and forged to have diameters of 50 mmφ. Thereafter the materials were further heated to a temperature of 1180° C., and hot-rolled to shapes having 10 mmφ. Final finishing temperatures of the rolling were within a range of 800° to 1000° C.

These rolled materials were wire-drawn with a perforated die for the purpose of elongation and surface cleaning, and thereafter subjected to shaving, to examine whether or not breakage or wire breaking was caused. As the result, there were those which could be subjected to wire drawing and shaving with no problems and those frequently causing breakage and wire breaking. It is presumed that causes for these are insufficient strength as to breakage, and insufficient toughness (including a case of excessively high strength) as to wire breaking. To this end, relations between presence/absence of occurrence of breakage etc. and tensile strength, reduction of area and elongation of each rolled material were examined. The results are shown in Table 1.

TABLE 1

| Sample | 1 | 2 | 3 | 4 | 5 | 6 | 7 | 8 | 9 | 10 |
|---|---|---|---|---|---|---|---|---|---|---|
| Wire Breaking | O | X | O | O | X | X | O | O | O | X |
| Breakage | O | X | O | O | X | X | X | O | O | X |

X indicates occurrence of wire breaking or breakage, and O indicates no such occurrence.

As shown in Table 1, it was proved that neither wire breaking nor breakage is caused in preparation and in practical use if tensile strength is 50 to 150 kgf/mm² (about 500 to 1500 MPa) and elongation and reduction of area are at least 5% respectively. However, the wire may be broken in repeated bending if tensile strength is in excess of 120 kgf/mm² (about 1200 MPa), and it was judged that a wire preferably having tensile strength of 50 to 120 kgf/mm² (about 500 to 1200 MPa) is preferable.

On the basis of such test results, further study was made with attention drawn to an oxygen content, a crystal grain size, and a crystal structure (ratio of diffraction peak intensity by X-ray diffraction: fcc(200)/{fcc(200)+hcp(101)+hcp(100)} (hereinafter referred to as an fcc ratio)) as alloy characteristics for attaining the aforementioned mechanical properties. In all of the following Test Examples, target references in tensile tests are tensile strength of 50 to 120 kgf/mm² and elongation and reduction of area of at least 5% respectively.

(Test Example 2)

(Relation between Oxygen Content, Crystal Grain Size, Crystal Structure and Rolling Temperature and Mechanical Properties)

Similarly to Test Example 1, excellent cast materials of 150 mmφ by 250 mm were obtained. At this time, oxygen contents were controlled by carbon (C) serving as a deoxidizer, to prepare six ingots for each of four types (samples A to D) having different oxygen contents. Each ingot was heated to a temperature of 1100° C. and forged into a shape having 50 mmφ, and thereafter hot-rolled into a shape having 10 mmφ within a temperature range of 600° to 1100° C. Compositions of wires prepared in the aforementioned steps are shown below.

| Sample | Co (wt %) | Ni (wt %) | C (wt %) | O (ppm) |
|---|---|---|---|---|
| A | Rest | 20.1 | 0.008 | 8 |
| B | Rest | 20.0 | 0.005 | 13 |
| C | Rest | 19.8 | 0.004 | 37 |
| D | Rest | 20.0 | 0.003 | 58 |

Crystal grain sizes and crystal structures were examined as to such respective materials. The results are shown in Table 2 with rolling temperatures.

TABLE 2

| Target Rolling Temperature (°C.) | Actual Rolling Temperature (°C.) | Crystal Grain Size (Mean) (μm) | Crystal Structure fcc Ratio |
|---|---|---|---|
| 600 | 602–613 | 30–35 | 0.61–0.73 |
| 700 | 692–710 | 28–37 | 0.53–0.65 |
| 800 | 803–823 | 42–58 | 0.40–0.52 |
| 900 | 896–918 | 51–75 | 0.28–0.42 |
| 1000 | 985–1023 | 68–88 | 0.21–0.35 |
| 1100 | 1090–1113 | 73–95 | 0.15–0.32 |

Actual rolling temperatures indicate working temperatures in final finishing rolling.

Ranges or variations present in the rolling temperatures, the crystal grain sizes and the crystal structures indicate that dispersion was present in each sample. Further, a tensile test was carried out in order to examine toughness of each sample. The results are shown in Table 3.

TABLE 3

| Target Rolling Temperature (°C.) | Tensile Strength (kgf/mm²) | | | | Reduction of Area (%) | | | | Elongation (%) | | | |
|---|---|---|---|---|---|---|---|---|---|---|---|---|
| | A | B | C | D | A | B | C | D | A | B | C | D |
| 600 | o | o | o | o | o | o | o | X | o | o | o | X |
| 700 | o | o | o | o | o | o | o | X | o | o | o | X |
| 800 | o | o | o | X | o | o | o | X | o | o | o | X |
| 900 | o | o | o | X | o | X | o | X | o | X | X | X |
| 1000 | X | o | o | X | o | X | o | X | X | X | o | X |
| 1100 | o | X | X | X | o | X | X | X | o | X | X | X | o indicates those satisfying target references, and X indicates those not satisfying the same.

The aforementioned results were analyzed, to prove the following facts:

(1) The crystal grain sizes and the fcc ratios of the crystal structures were hardly influenced by the oxygen contents. In other words, it is inferred that there is not much correlation between the same. Therefore, the fcc ratios of the crystal grain sizes and the crystal structures must be examined independently of the oxygen contents.

(2) As to toughness, he sample D was improper although excellent ones were present in the samples A to C. Thus, it is assumed that the oxygen contents are related to toughness.

(3) Further, those having excellent toughness and inferior toughness are present in the samples A to C depending on the rolling temperatures, and these samples are generally exhibit a tendency that excellent results are attained in low-temperature working.

(4) However, the materials which were rolled at temperatures of not more than 800° C. also included those having relatively low tensile strength, elongation and reduction of area, while the materials worked at high temperatures included those having relatively high mechanical properties.

From these facts, the inventors considered that toughness cannot be correctly judged simply from the working temperatures, and decided to examine relations between the crystal grain sizes and the crystal structures and the mechanical properties for the respective materials having different oxygen contents in further detail.

(Test Example 3)
(Toughness of High Oxygen Content Material)

The sample D (oxygen Content: 50 to 55 ppm) was again cast and forged through steps similar to those in Test Example 2 as a high oxygen content material, to prepare 10 materials having diameters of 50 mmφ. These were rolled at temperatures of 700°, 800°, 900°, 1000° and 1100° C. to prepare two wires at each rolling temperature. These wires were subjected to examination of crystal grain sizes and fcc ratios of crystal structures, as well as to a tensile test. The results are shown in Table 4.

TABLE 4

| Target Rolling-Temperature (°C.) | Actual Rolling-Temperature (°C.) | Tensile Strength (kgf/mm²) | Elongation (%) | Reduction of area (%) | Crystal Grain Size (μm) | Crystal Structrue fcc Ratio | Oxygen Content (ppm) |
|---|---|---|---|---|---|---|---|
| 700 | 710–723 | 72.3 | 4.5 | 3.2 | 32–38 | 0.54 | 50 |
| 700 | 695–713 | 65.2 | 3.8 | 3.1 | 30–41 | 0.60 | 53 |
| 800 | 805–820 | 63.8 | 2.9 | 2.3 | 41–48 | 0.58 | 51 |
| 800 | 795–809 | 61.2 | 2.7 | 2.1 | 38–45 | 0.51 | 52 |
| 900 | 889–903 | 52.3 | 1.1 | 1.6 | 57–71 | 0.43 | 53 |
| 900 | 901–917 | 51.6 | 1.6 | 1.3 | 63–82 | 0.48 | 52 |
| 1000 | 985–1005 | 42.8 | 1.3 | 0.5 | 71–86 | 0.21 | 55 |
| 1000 | 1002–1023 | 45.6 | 1.2 | 0.4 | 73–90 | 0.28 | 50 |
| 1100 | 1090–1110 | 38.6 | 1.0 | 0.1 | 88–97 | 0.16 | 54 |

TABLE 4-continued

| Target Rolling-Temperature (°C.) | Actual Rolling-Temperature (°C.) | Tensile Strength (kgf/mm²) | Elongation (%) | Reduction of area (%) | Crystal Grain Size (μm) | Crystal Structrue fcc Ratio | Oxygen Content (ppm) |
|---|---|---|---|---|---|---|---|
| 1100 | 1002–1110 | 42.1 | 1.1 | 0.1 | 83–95 | 0.25 | 51 |

As shown in Table 4, it was confirmed that a target reference toughness was not attained regardless of the fcc ratios of the crystal grain sizes and the crystal structures in the sample D of 50 to 50 ppm in oxygen content.

(Test Example 4)
(Toughness of Intermediate Oxygen Content Material)

Then, the sample C (oxygen content: 32 to 36 ppm) was again cast and forged similarly to Test Example 2 as an intermediate oxygen content material, to prepare 10 materials having diameters of 50 mmφ. These were rolled at temperatures of 700°, 800°, 900°, 1000° and 1100° C. to prepare two wires at each rolling temperature. These wires were subjected to examination of crystal grain sizes and fcc ratios of crystal structures as well as to a tensile test. The results are shown in Table 5.

As the result, it was proved that the target reference of toughness is satisfied when the crystal grain size is not more than 80 μm and the fcc ratio of the crystal structure is at least 0.3, similarly to Test Example 4. Then, the as-obtained rolled materials (10 mmφ in diameter) were subjected to final working targets of drawing and shaving. Values of reduction in area of the drawing are 8, 10 and 15%, and amounts of shaving are 0.2, 0.3 and 0.4 mm. As the result, it was confirmed possible to stably work a material having tensile strength of 50 to 120 kgf/mm² as well as elongation and reduction of area of at least 5% respectively.

It was also confirmed that toughness is further improved when a rolled material is annealed at a temperature of not more than 1000° C. preferably within a temperature range of 400° to 800° C. Namely, even a material which is impossible to draw after rolling is im-

TABLE 5

| Terget Rolling-Temperature (°C.) | Actual Rolling-Temperature (°C.) | Tensile Strength (kgf/mm²) | Elongation (%) | Reduction of area (%) | Crystal Grain Size (μm) | Crystal Structure fcc Ratio | Oxygen Content (ppm) |
|---|---|---|---|---|---|---|---|
| 700A | 695–713 | 96.5 | 16.3 | 18.2 | 30–42 | 0.65 | 33 |
| 700B | 685–705 | 93.2 | 17.1 | 19.3 | 31–45 | 0.68 | 34 |
| 800A | 804–825 | 88.6 | 15.5 | 14.2 | 38–49 | 0.57 | 34 |
| 800B | 795–813 | 85.2 | 13.2 | 13.8 | 41–48 | 0.56 | 36 |
| 900A | 890–911 | 72.3 | 9.6 | 8.7 | 55–72 | 0.48 | 32 |
| 900B | 910–925 | 75.8 | 9.8 | 7.8 | 51–63 | 0.43 | 33 |
| 1000A | 1005–1028 | 52.6 | 6.0 | 5.8 | 68–76 | 0.37 | 36 |
| 1000B | 998–1014 | 52.8 | 4.1 | 3.8 | 71–79 | 0.25 | 35 |
| 1100A | 1063–1083 | 50.0 | 5.1 | 5.3 | 68–80 | 0.30 | 34 |
| 1100B | 1075–1098 | 45.2 | 5.2 | 5.0 | 83–98 | 0.31 | 35 |

The above results are studied in detail. In general, those having low rolling temperatures tend to show excellent results. However, there exist both of those satisfying and not satisfying target reference of toughness in the materials rolled at the temperatures of 1000° C. and 1100° C. The 1100B material having large crystal grain sizes had low tensile strength while the 1010B material having a crystal structure fcc ratio of 0.25 was inferior in points of elongation and reduction of area. From these facts, it was proved that factors satisfying the target reference of toughness are not the rolling temperature but the oxygen content, the crystal grain size, and the crystal structure. Namely, it is understood that prescribed toughness can be attained if the oxygen content is not more than 40 ppm, the crystal grain size is not more than 80 μm, and the crystal structure fcc ratio is at least 0.3.

(Test Example 5)
(Toughness of Low Oxygen Content Material)

Further, the sample A (oxygen content: 6 to 10 ppm) and the sample B (oxygen content: 12 to 18 ppm) were again cast and forged similarly to Test Example 2 as materials of low oxygen contents, to prepare 10 materials having diameters of 50 mmφ. These were rolled at temperatures of 700°, 800°, 900°, 1000° and 110° C., to prepare two wires as to each rolling temperature. As to these wires, grain sizes and fcc ratios of crystal structures were examined and a tensile test was performed.

proved in crystal structure etc. by such annealing, to allow drawing etc.

EXAMPLE 3

Samples (Example and comparative example) prepared from Co—Ni alloys (No. 1 to No. 13) having components shown in Table 6 were subjected to evaluation of workability and magnetic properties.

TABLE 6

| | Sample | Component (wt %) | | | | | | |
| | | C | Ni | Mn | Fe | P | S | Al |
|---|---|---|---|---|---|---|---|---|
| Comparative Sample | 1 | 0.005 | 20.2 | 0.002 | 0.01 | 0.001 | 0.001 | <0.001 |
| | 2 | 0.004 | 20.1 | 0.008 | 0.01 | 0.001 | 0.001 | <0.001 |
| Inventive Sample | 3 | 0.005 | 20.0 | 0.010 | 0.01 | 0.001 | 0.001 | <0.001 |
| | 4 | 0.005 | 19.9 | 0.021 | 0.01 | 0.001 | 0.001 | <0.001 |
| | 5 | 0.004 | 20.3 | 0.038 | 0.02 | 0.001 | 0.001 | <0.001 |
| | 6 | 0.004 | 20.1 | 0.050 | 0.01 | 0.001 | 0.001 | <0.001 |
| | 7 | 0.004 | 20.2 | 0.061 | 0.01 | 0.002 | 0.001 | <0.001 |
| | 8 | 0.004 | 19.8 | 0.072 | 0.01 | 0.001 | 0.001 | <0.001 |
| | 9 | 0.004 | 20.1 | 0.080 | 0.02 | 0.001 | 0.001 | <0.001 |
| | 10 | 0.005 | 20.0 | 0.089 | 0.01 | 0.001 | 0.001 | <0.001 |
| | 11 | 0.005 | 20.2 | 0.099 | 0.01 | 0.001 | 0.001 | <0.001 |
| Comparative Sample | 12 | 0.004 | 20.0 | 0.111 | 0.01 | 0.001 | 0.001 | <0.001 |
| | 13 | 0.004 | 20.1 | 0.119 | 0.01 | 0.001 | 0.001 | <0.001 |

Figure 6:
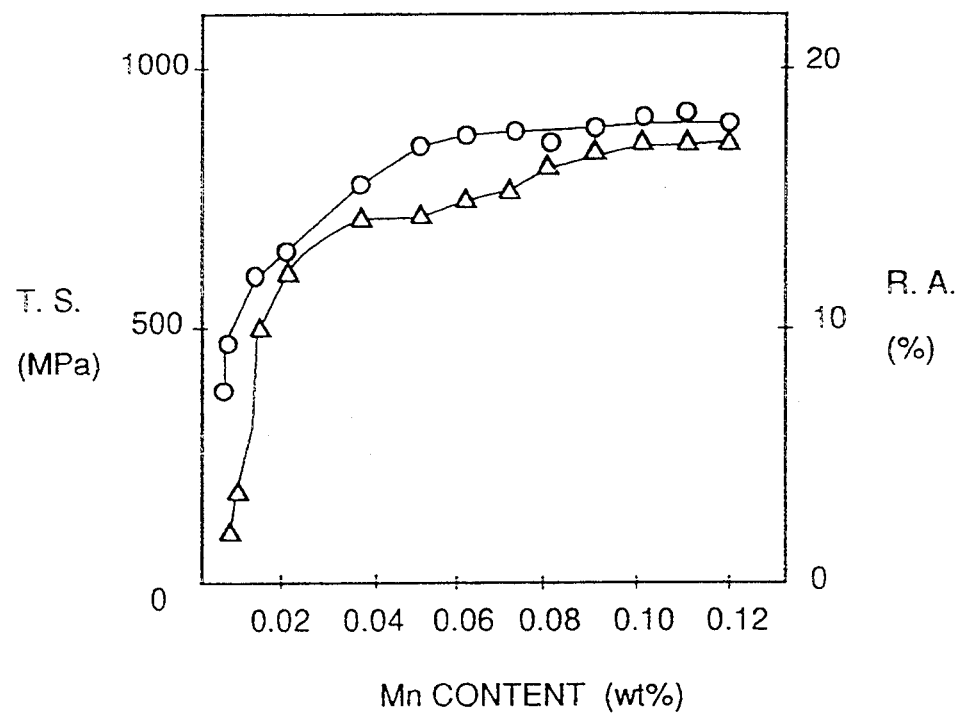
FIG. 6 is a graph showing relations between amounts of addition of Mn and workability in Co—Ni alloys.
Figure 7:
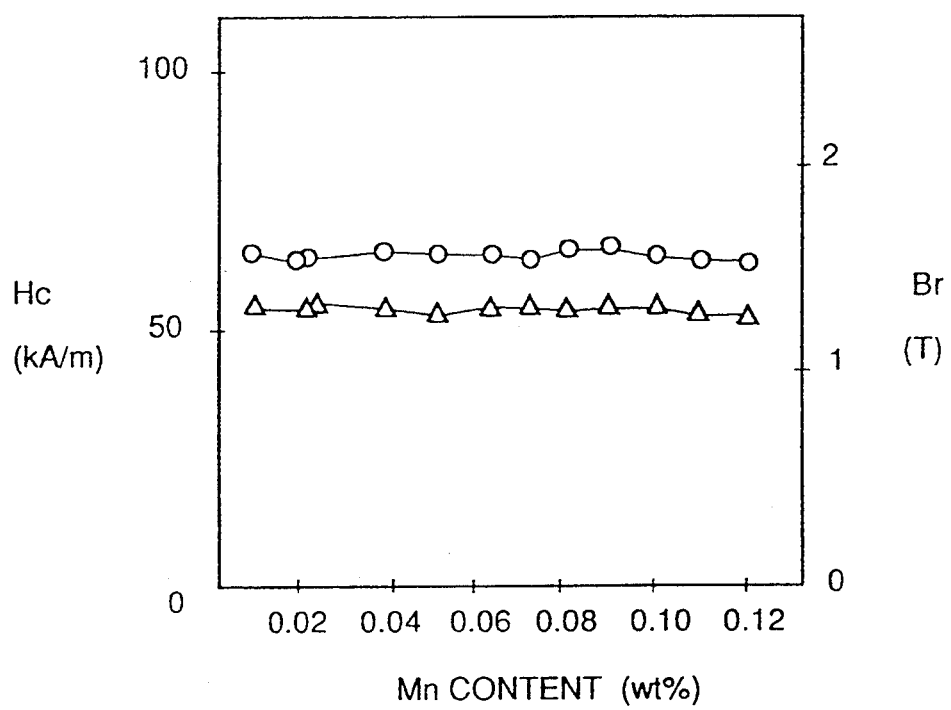
FIG. 7 is a graph showing relations between amounts of addition of Mn and magnetic properties in the Co—Ni alloys.

The respective samples were subjected to hot rolling to shapes having diameters of 10.0 mmφ, and workability was evaluated through mechanical properties (tensile strength and reduction of area) at room temperature. Further, the magnetic properties (coercive force and residual magnetic flux density) were evaluated in states of working the aforementioned respective samples into evaporation materials and evaporating the same on tapes serving as base materials. The workability and the magnetic properties are shown in FIGS. 6 and 7 respectively. Referring t FIG. 6, ◯ represents tensile strength: T.S. (MPa) and △ represents reduction of area: R.A. (%), while ◯ represents coercive force: Hc (kA/m) and △ represents residual magnetic flux density: Br (T) in FIG. 7.

As shown in FIG. 6, improvement in reduction of area was recognized in Co—Ni alloys containing at least 0.01 weight % of Mn, and improvement of workability was confirmed. When the amounts exceeded 0.1 weight %, on the other hand, an effect of improvement in workability was hardly recognized regardless of the contents of Mn.

As shown in FIG. 7, on the other hand, deterioration of magnetic properties was hardly recognized regardless of the Mn contents.

EXAMPLE 4

Figure 8:
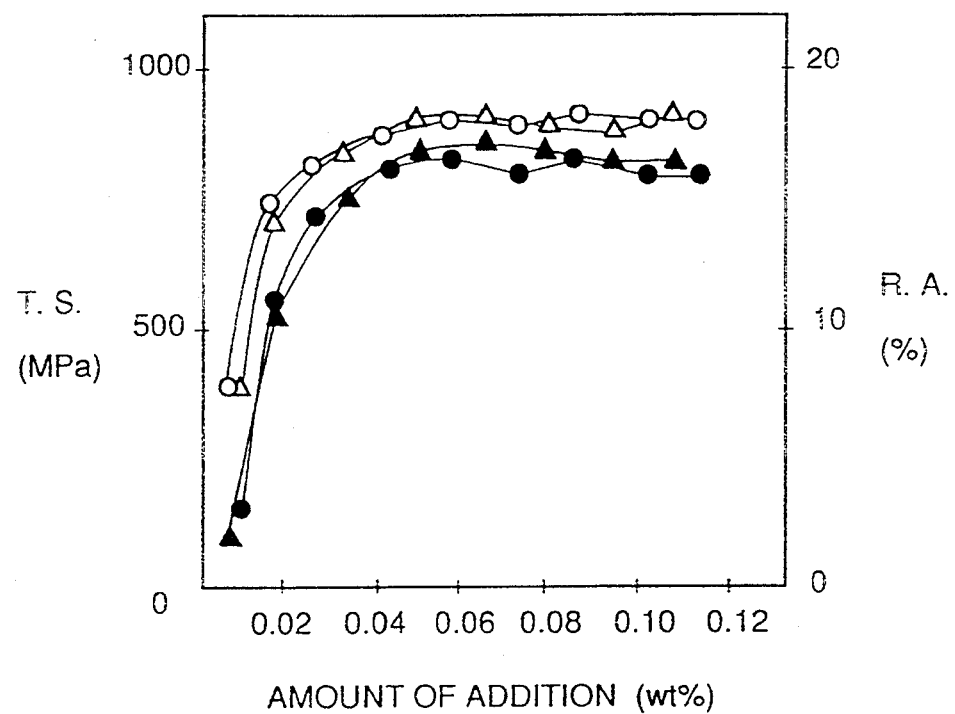
FIG. 8 is a graph showing relations between amounts of addition of Mg or Ca and workability in the Co—Ni alloys.
Figure 9:
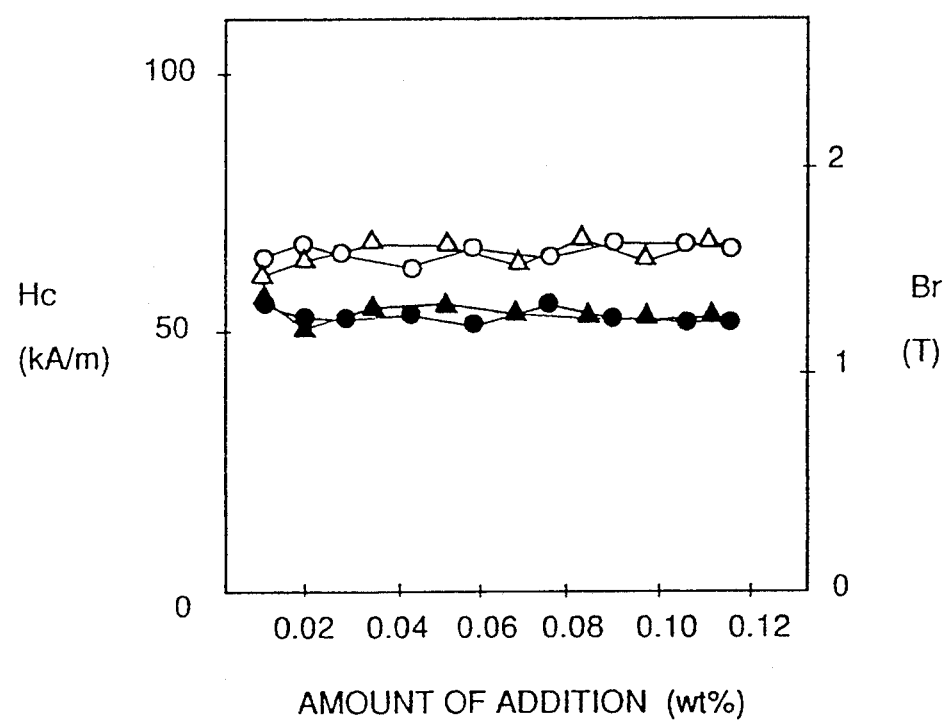
FIG. 9 is a graph showing relations between amounts of addition of Mg or Ca and magnetic properties in the Co—Ni alloys.

Then, in each sample which was similar to that in Example 3, Mg or Ca was added in place of Mn to measure workability (tensile strength and reduction of area) and magnetic properties (coercive force and residual magnetic flux density) of the as-obtained sample. Relations between the amounts of addition and respective characteristics are shown in FIG. 8 and FIG. 9. Referring to FIG. 8, circles indicate Mg and triangles indicate Ca, while white marks show tensile strength: T.S. (MPa) and black marks indicate reduction of area: R.A. (%). Referring to FIG. 9, on the other hand, circles indicate Mg and triangles indicate Ca, while white marks show coercive force: Hc (kA/m) and black marks show residual magnetic flux density: B (T).

Also in the case of this Example, improvement in reduction of area was recognized and improvement in workability was confirmed in Co—Ni alloys containing at least 0.01 weight % of Mg of Ca as shown in FIG. 8, similarly to Example 3. When the amounts exceeded 0.1 weight %, on the other hand, an effect of improvement in workability was hardly recognized regardless of the amounts of addition of Mg or Ca.

As shown in FIG. 9, further, deterioration of magnetic properties was hardly recognized regardless of the amounts of addition of Mg or Ca.

EXAMPLE 5

Figure 10:
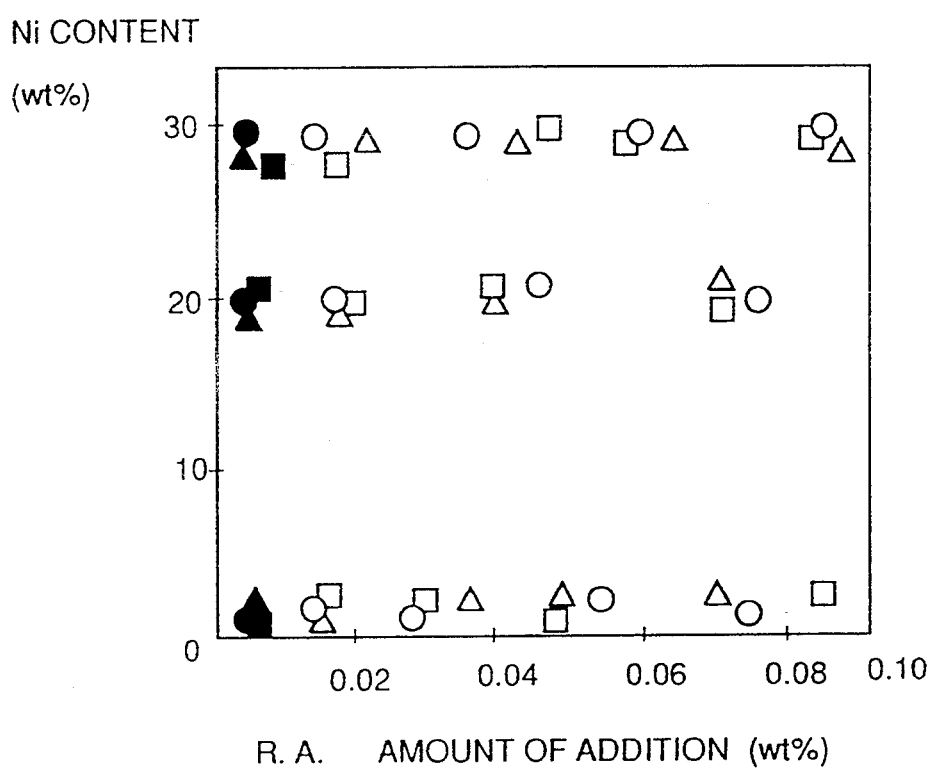
FIG. 10 is a graph showing relations between amounts of additional elements and reduction of area in Co alloys having different Ni contents.

Further, reduction of area was measured in Co alloys (three types having Ni contents of 1, 20 and 30 weight %) having different Ni contents by a test similar to those in Examples 3 and 4. The results are shown in FIG. 10. Referring to FIG. 10, circles indicate Mn, triangles indicate Mg and square marks indicate Ca, while white or non-filled marks indicate reduction of area of at least 10% and black marks indicate reduction of area of less than 10%.

As shown in FIG. 10, it was confirmed that reduction of area is improved and workability is improved by addition of at least 0.01 weight % of a prescribed element.

EXAMPLE 6

First, Co of substantially 100 weight % was prepared by 100 kg in a vacuum fusion furnace. This was subjected to hot working, to prepare wires of 15, 12, 10, 8, 6, 4, 2, 1, 0.8 and 0.5 mm in diameter having lengths of at least 1000 times the respective diameters. These were fed into a crucible provided in a vacuum chamber of an evaporation unit in practice.

As the result, the wires of 15 mm and 12 mm in diameter were inferior in workability since the same were so hard that it was extremely difficult to handle these wires, while it was impossible to stably feed the wires of 0.8 mm and 0.5 mm in diameter since the same were bent in feeding, although these wires were easy to handle. On the other hand, it was possible to stably feed the remaining wires.

EXAMPLE 7

Figure 11:
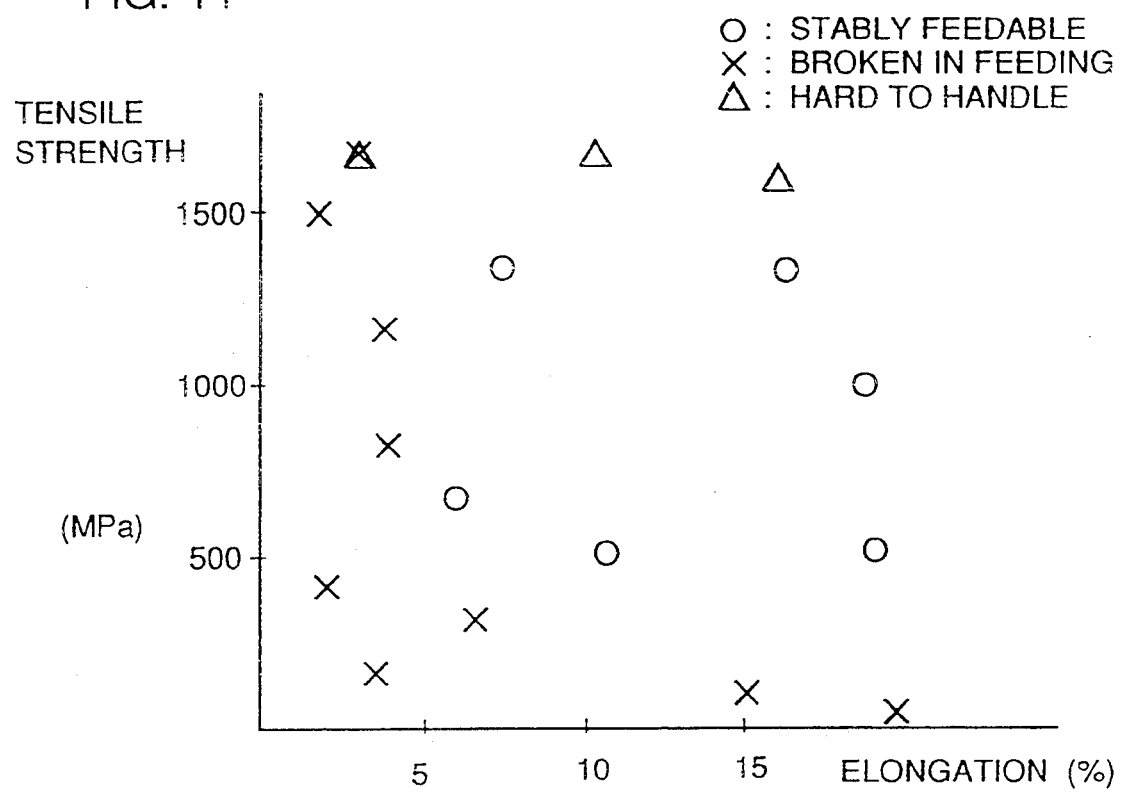
FIG. 11 is a graph showing relations between elongation and tensile strength as test results of mechanical properties of evaporation materials.
Figure 12:
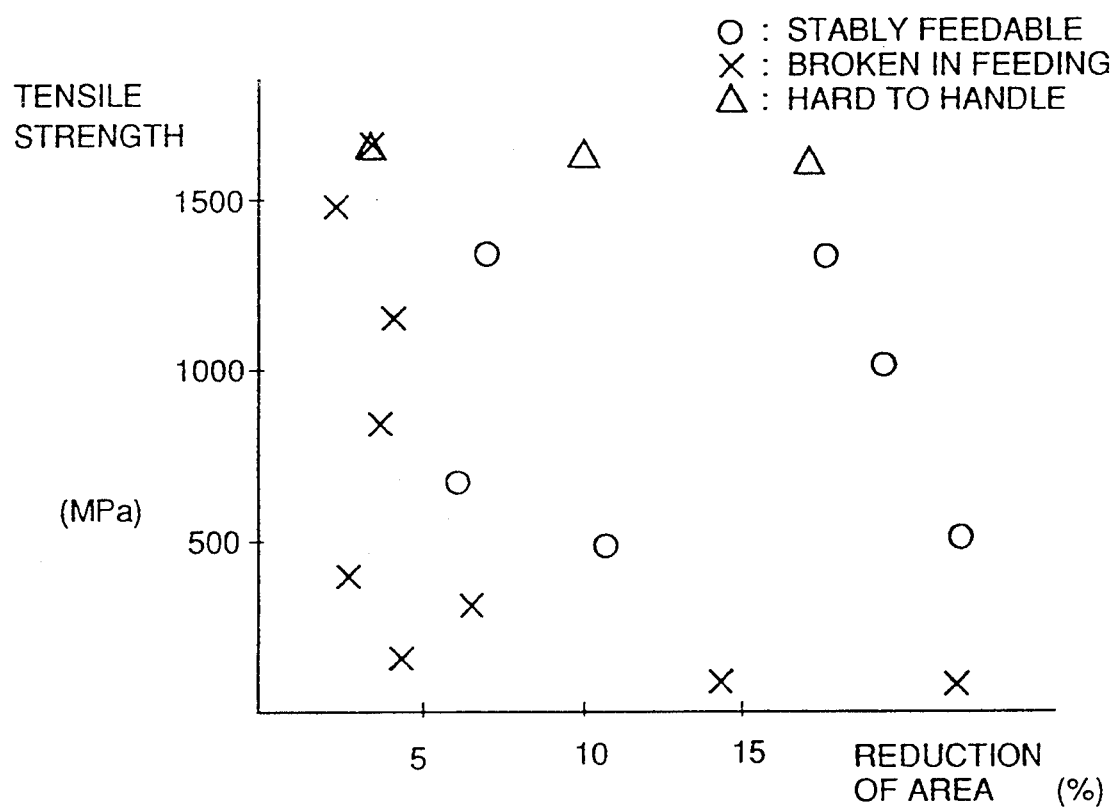
FIG. 12 is a graph showing relations between reduction of area and tensile strength as test results of mechanical properties of the evaporation materials.

Then, substantially 100 weight % of Co was prepared in a vacuum fusion furnace by 100 kg similarly to Example 6, and subjected to hot working to cast wires of 5 mm in diameter. At this time, working conditions and heat treatment conditions were adjusted to obtain wires having various mechanical properties (tensile strength, elongation and reduction of area), and a feeding test was made similarly to Example 6. The results are shown in FIGS. 11 and 12. As shown in FIGS. 11 and 12, those of less than 400 MPa in tensile strength were insufficient in strength and caused wire breaking. On the other hand, those exceeding 1500 MPa in tensile strength were so hard that it was difficult to handle and feed the same.

When elongation (FIG. 11) and reduction of area (FIG. 12) were not more than 5% respectively, no stable feeding was attained such that breakage was caused during feeding.

EXAMPLE 8

Further, wires similar to those of Example 7 were prepared and surfaces thereof were mechanically ground and further washed with an organic solvent. Then, an energy dispersive X-ray analyzer System (EDS: Energy Dispersive X-ray Analyzer System) was employed to analyze impurities on the surfaces of the respective wires before grinding, after grinding and after washing.

As the result, large quantities of impurities such as oxides were analyzed before the grinding. Further, lubricants in grinding etc. were analyzed on the surfaces of the wires after the grinding. After the washing with the organic solvent, on the other hand, absolutely no deposits were analyzed on he surfaces of the wires.

EXAMPLE 9

Co of 99.9% in purity was subjected to measurement of reduction of area by a tensile test at room temperature while varying values of $f1/(f1+h1+h2)$ with differences of working conditions (working temperature and ratio). Symbols $f1$, $h1$ and $h2$ represent diffraction peak intensity values (cps) corresponding to a (200) plane of a face centered cubic lattice (fcc), a (100) plane of a close-packed hexagonal lattice (hcp) and a (101) plane of the close-packed hexagonal lattice (hcp) in X-ray diffraction respectively. The results of the test are shown in FIG. 13.

Figure 13:
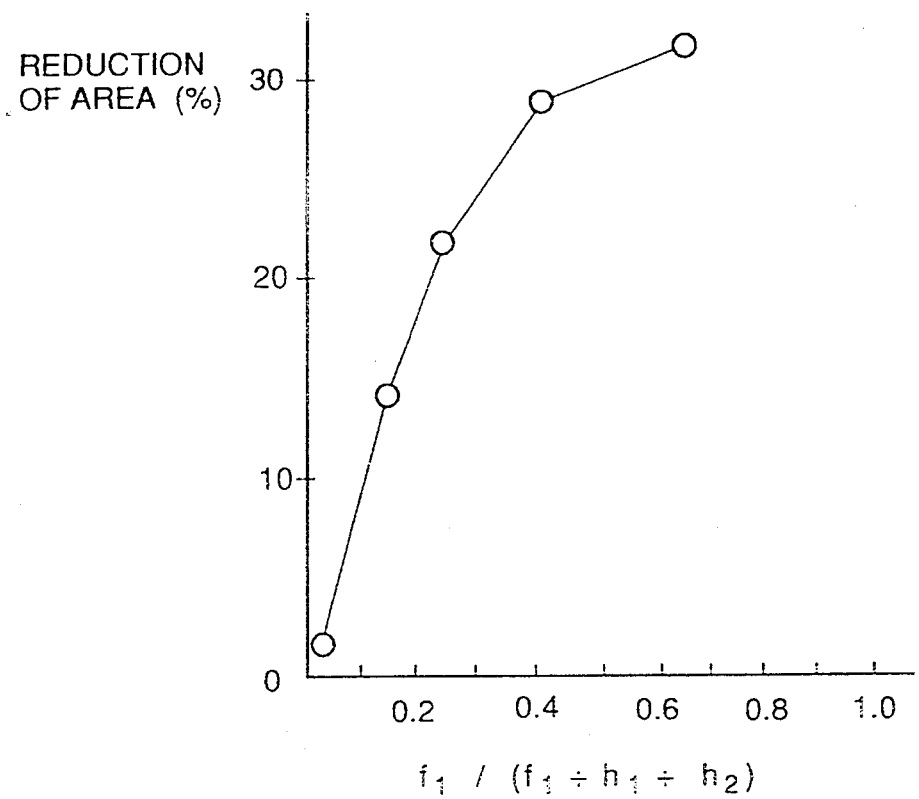
FIG. 13 is a graph showing a relation between a crystal structure of an evaporation material and values of reduction of area.

As shown in FIG. 13, it was confirmed that excellent workability was attained with reduction of area of at least 10% by controlling the values of $f1/(f1+h1+h2)$ to be at least 0.1 and not more than 1.0.

EXAMPLE 10

Figure 14:
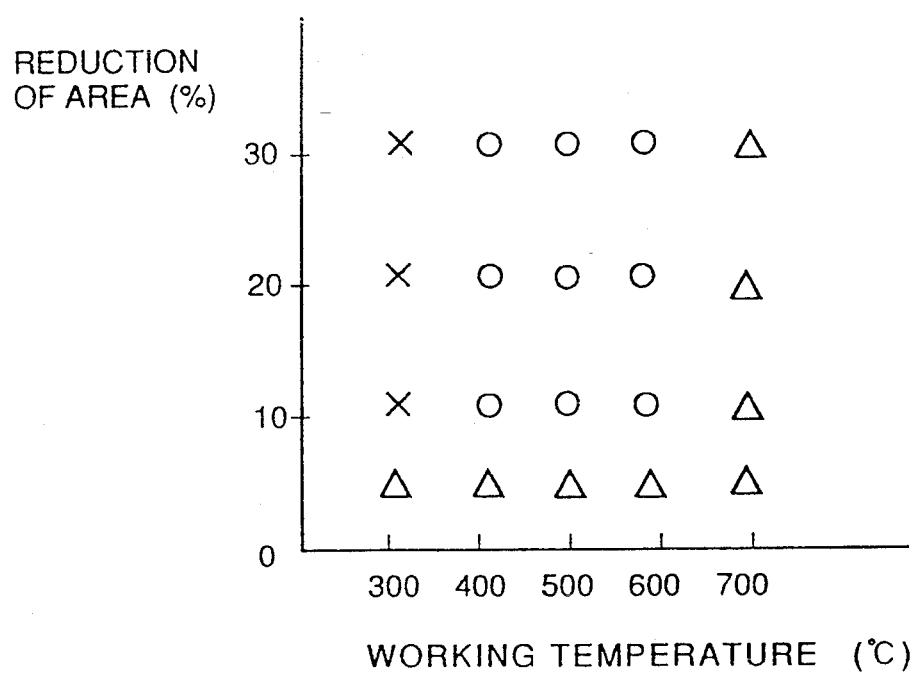
FIG. 14 is a graph showing differences of values of reduction of area in a case of performing different types of working in combinations of working temperatures and reduction in area.

Then, Co materials similar to those in Example 9 were worked under different conditions (working temperature and ratio), cooled at a speed of 1° C./sec., and thereafter subjected to a tensile test at room temperature, for evaluation of reduction of area. The results are shown in FIG. 14. Referring to Fig. 14, marks X indicate that working was impossible, marks Δ indicate that reduction of area after working was less than 10%, and marks ○ indicate that reduction of area after working was at least 10%. As clearly understood from FIG. 14, it was confirmed that those subjected to working at working temperatures of 400° to 600° C. with reduction in area of at least 10% exhibited high values of reduction of area, and were excellent in workability.

EXAMPLE 11

Figure 15:
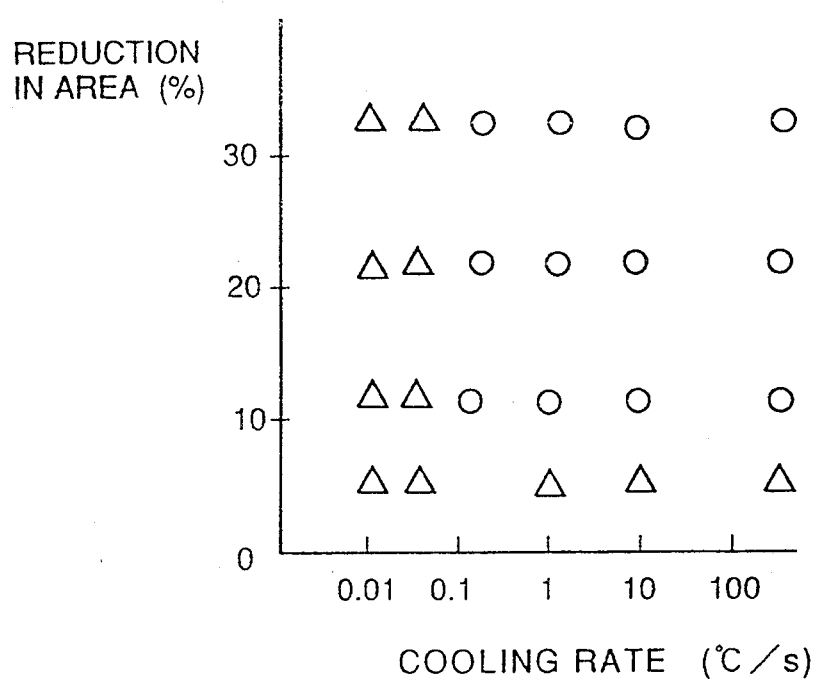
FIG. 15 is a graph showing differences of values of reduction of area in evaporation materials in a case of varying combinations of reduction in area and cooling rates.

Further, Co materials similar to those in Example 9 were worked at a working temperature of 500° C. with different values of reduction in area, and cooling rates after the working were also varied to perform a tensile test on the as-obtained materials at room temperature, thereby evaluating reduction of area. The results are shown in FIG. 15. Referring to FIG. 15, marks ○ indicate reduction of area of at least 10%, and marks Δ indicate reduction of area of less than 10%. As clearly understood from FIG. 15, it was confirmed that even if working of at least 10% in reduction in area was performed at a temperature of 500° C., a cold tensile property (reduction of area) thereafter attained was low and workability was insufficient when the cooling rate after the working was less than 0.1° C./sec.

EXAMPLE 12

Wires (Tu=380° C. and Td=200° C.) of Co alloys containing 20 weight % of Ni were heated to prescribed temperatures, and subjected to drawing of 14% in reduction in area in later natural cooling processes. Table 7 shows mechanical properties attained after the working at room temperature. Working temperatures appearing in Table 7 indicate temperatures immediately before working, and the wires having both of elongation and reduction of area of at least 20% are regarded as excellent as to reference Of the mechanical properties (this also applies to the following Examples 13 to 15).

TABLE 7

|  | Sample | Heating Temperature (°C.) | Working Temperature (°C.) | Tensile Strength (MPa) | Elongation (%) | Reduction of Area (%) |
| --- | --- | --- | --- | --- | --- | --- |
| Comparative Sample | I-A | 300 | 292 | (Allowed no wire drawing) | | |
| Inventive Sample | I-B | 400 | 393 | 607 | 20 | 21 |
| Inventive Sample | I-C | 500 | 491 | 615 | 22 | 23 |
| Comparative Sample | I-D | 600 | 592 | 608 | 9 | 8 |
| Comparative Sample | I-E | 700 | 689 | 612 | 5 | 8 |
| Comparative Sample | I-F | 800 | 790 | 601 | 6 | 7 |
| Comparative Sample | I-G | 900 | 888 | 582 | 5 | 3 |
| Comparative Sample | I-H | 1000 | 989 | 603 | 4 | 4 |

As shown in Table 7, it was confirmed that I-B and I-C, which were temporarily heated in excess of Tu and worked at temperatures of at least Td and not more than Tu +200° C. were superior in mechanical properties to other comparative samples.

Then, mechanical properties were examined as to a case of heating similar alloy wire materials to a temperature of 1000° C. and performing drawing of 14% in reduction in area in later forced cooling processes. The results are shown in Table 8.

TABLE 8

|  | Sample | Heating Temperature (°C.) | Working Temperature (°C.) | Tensile Strength (MPa) | Elongation (%) | Reduction of Area (%) |
| --- | --- | --- | --- | --- | --- | --- |
| Inventive Sample | II-A | 1000 | 301 | 622 | 21 | 20 |
| Inventive Sample | II-B | 1000 | 399 | 619 | 23 | 22 |
| Inventive Sample | II-C | 1000 | 502 | 618 | 20 | 20 |
| Comparative Sample | II-D | 1000 | 601 | 605 | 9 | 8 |
| Comparative Sample | II-E | 1000 | 698 | 601 | 6 | 8 |
| Comparative Sample | II-F | 1000 | 797 | 613 | 7 | 6 |
| Comparative Sample | II-G | 1000 | 904 | 590 | 4 | 6 |

According to this test, all samples were temporarily heated to at least Tu, while temperatures in later working were varied with the samples. It was confirmed that inventive samples having working temperatures of at least Td and not more than Tu+200° C. were superior in mechanical properties to other comparative samples having working temperatures exceeding Tu+200° C.

Figure 16:
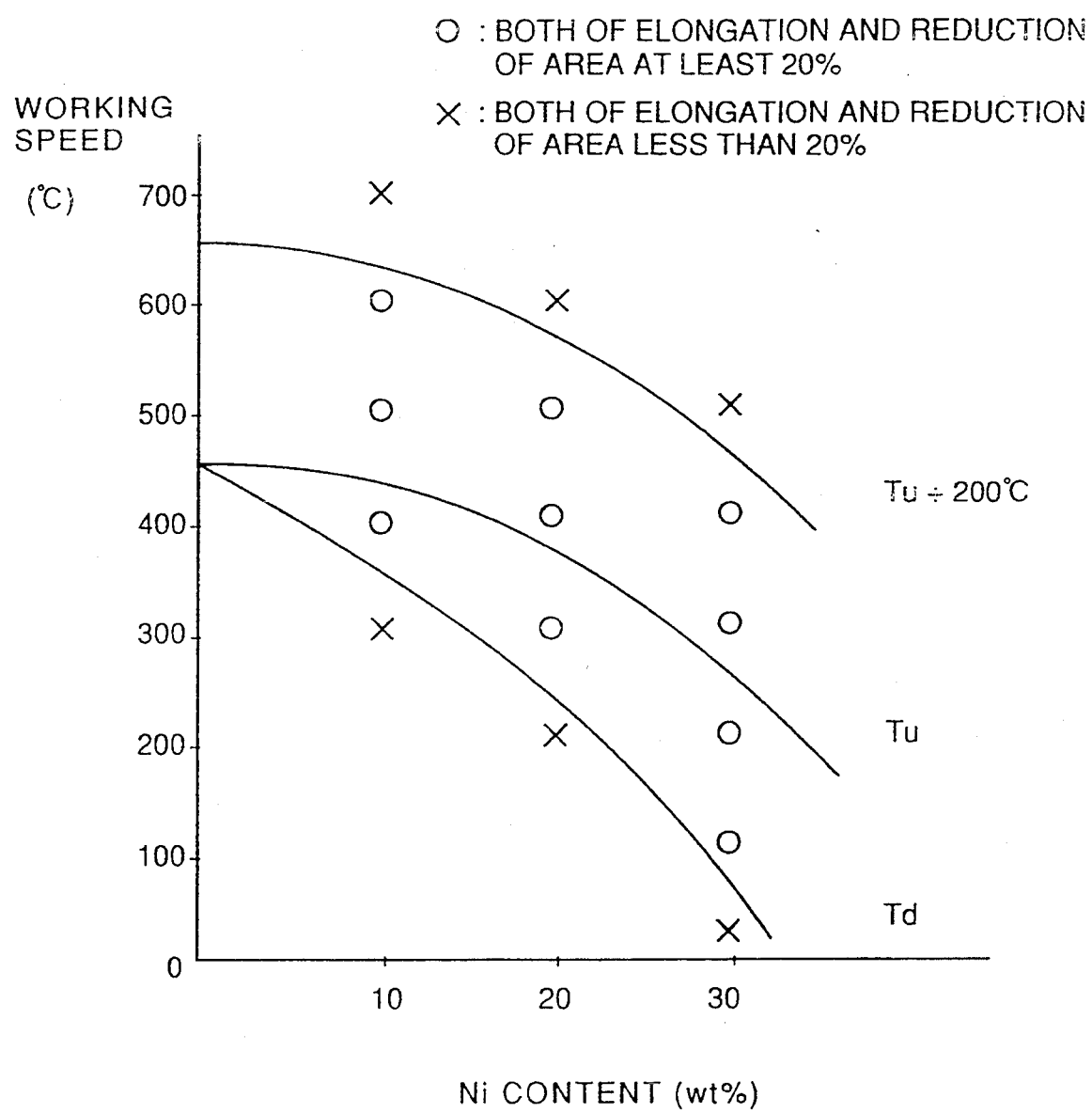
FIG. 16 is a graph showing results of decision of mechanical properties at respective working temperatures as to Co alloys having different Ni contents.

Further, Co alloys containing 10 weight % or 30 weight % of Ni were also temporarily heated to a temperature of 1000° C. and subjected to drawing of 14% in reduction in area in later cooling processes, for evaluation of mechanical properties. The results at this time are shown in a graph of FIG. 16. Samples having both elongation and reduction of area of at least 20% are shown by marks o and those having both elongation and reduction of area of less than 20% are shown by marks Δ. As clearly understood from FIG. 16, it was confirmed that excellent mechanical properties can be obtained by working at temperatures of at leas Td and not more than Tu+200° C. in all cases of the Ni contents.

nized, while excellent results are shown with elongation and reduction of area of at least 20% in all samples since drawing was performed at a temperature of about 400° C. in the cooling processes.

EXAMPLE 14

Wires of Co alloys containing 20 weight % of Ni were subjected to drawing with different values of reduction in area at a heating temperature of 600° C. and a working temperature of 400° C. in later cooling processes. Then, mechanical properties at the room temperature after the working were examined. The results are shown in Table 10.

TABLE 10

|  | Sample | Reduction in Area (%) | Tensile Strength (MPa) | Elongation (%) | Reduction of Area (%) |
|---|---|---|---|---|---|
| Comparative Sample | IV-A | 3.6 | 580 | 4 | 6 |
| Comparative Sample | IV-B | 8.9 | 601 | 8 | 9 |
| Inventive Sample | IV-C | 14.0 | 618 | 23 | 20 |
| Inventive Sample | IV-D | 21.0 | 558 | 22 | 20 |
| Inventive Sample | IV-E | 25.4 | 625 | 24 | 25 |
| Inventive Sample | IV-F | 29.5 | 616 | 22 | 20 |
| Comparative Sample | IV-G | 36.0 | 639 | 8 | 9 |
| Comparative Sample | IV-H | 40.3 | (Allowed no Drawing) | | |

Example 13

Wires of Co alloys containing 15 weight % of Ni were heated to prescribed temperatures, and subjected to drawing of 14% in reduction in area in later cooling processes. Working temperatures were 400° C. in all samples. Mechanical properties at room temperature after the working are shown in Table 9.

As shown in Table 10, it was confirmed that the mechanical properties were insufficient in all of samples IV-A, B, G and H, while those subjected to working of 10 to 30% in reduction in area exhibited excellent results with both of elongation and reduction of area of at least 20%.

Further, working was performed also on Co alloys containing 10 weight % or 30 weight % of Ni under

TABLE 9

|  | Sample | Heating Temperature (°C.) | Working Temperature (°C.) | Tensile Strength (MPa) | Elongation (%) | Reduction of Area (%) |
|---|---|---|---|---|---|---|
| Inventive Sample | III-A | 500 | 402 | 622 | 22 | 21 |
| Inventive Sample | III-B | 600 | 399 | 618 | 23 | 20 |
| Inventive Sample | III-C | 700 | 398 | 619 | 22 | 22 |
| Inventive Sample | III-D | 800 | 403 | 609 | 20 | 20 |
| Inventive Sample | III-E | 900 | 401 | 621 | 20 | 21 |
| Inventive Sample | III-F | 1000 | 402 | 615 | 21 | 23 |

As shown in Table 9, no difference in mechanical properties based on working temperatures is recognized, similar conditions, to examine mechanical properties. The results are shown in Table 11.

TABLE 11

|  | Sample | Ni Content (wt %) | Reduction in Area (%) | Tensile Strength (MPa) | Elongation (%) | Reduction of Area (%) |
|---|---|---|---|---|---|---|
| Comparative Sample | V-A | 10 | 3.6 | 590 | 2 | 3 |
| Inventive Sample | V-B | 10 | 14.0 | 602 | 20 | 21 |
| Inventive Sample | V-C | 10 | 25.4 | 605 | 21 | 22 |
| Comparative Sample | V-D | 10 | 403 | 631 | 8 | 7 |
| Comparative Sample | V-E | 30 | 3.6 | 601 | 9 | 8 |
| Inventive Sample | V-F | 30 | 14.0 | 612 | 28 | 26 |
| Inventive Sample | V-G | 30 | 25.4 | 603 | 29 | 25 |
| Comparative | V-H | 30 | 403 | 598 | 9 | 9 |

TABLE 11-continued

| Sample | Ni Content (wt %) | Reduction in Area (%) | Tensile Strength (MPa) | Elongation (%) | Reduction of Area (%) |
|---|---|---|---|---|---|
| Sample | | | | | |

As shown in Table 11, it was confirmed that wires of the Co alloys containing 10 weight % or 30 weight % of Ni also exhibit excellent ductility by drawing of 10 to 30% in reduction in area.

EXAMPLE 15

Further, wires of Co alloys containing 20 weight % of Ni were subjected to drawing of 14% in reduction in area at a heating temperature of 600° C. and a working temperature of 400° C. in later cooling processes. Cooling rates after the working were varied with the respective samples, to examine mechanical properties of the as-obtained wires at room temperature. The results are shown in Table 12.

TABLE 12

| Sample | Cooling Rate (°C./sec) | Tensile Strength (MPa) | Elongation (%) | Reduction of Area (%) |
|---|---|---|---|---|
| VI-A | 400 | 624 | 24 | 22 |
| VI-B | 10 | 620 | 24 | 22 |
| VI-C | 1 | 615 | 21 | 22 |
| VI-D | 0.1 | 621 | 22 | 21 |
| VI-E | 0.03 | 601 | 8 | 7 |
| VI-F | 0.01 | 607 | 4 | 5 |

As shown in Table 12, it was confirmed that excellent mechanical properties can be obtained if the cooling rate after working is at least 0.1° C./sec.

EXAMPLE 16

First, a material prepared by fusing 80 kg of Co and 20 kg of Ni and casting the same in the atmosphere was hot-forged, to thereafter prepare rolled wires of about 10 mmφ. These wires were again subjected to rolling of 5, 10 and 20% in reduction in area at temperatures of 100° to 900° C., to examine tensile strength values and elongation values of the long evaporation materials after the working.

Figure 17:
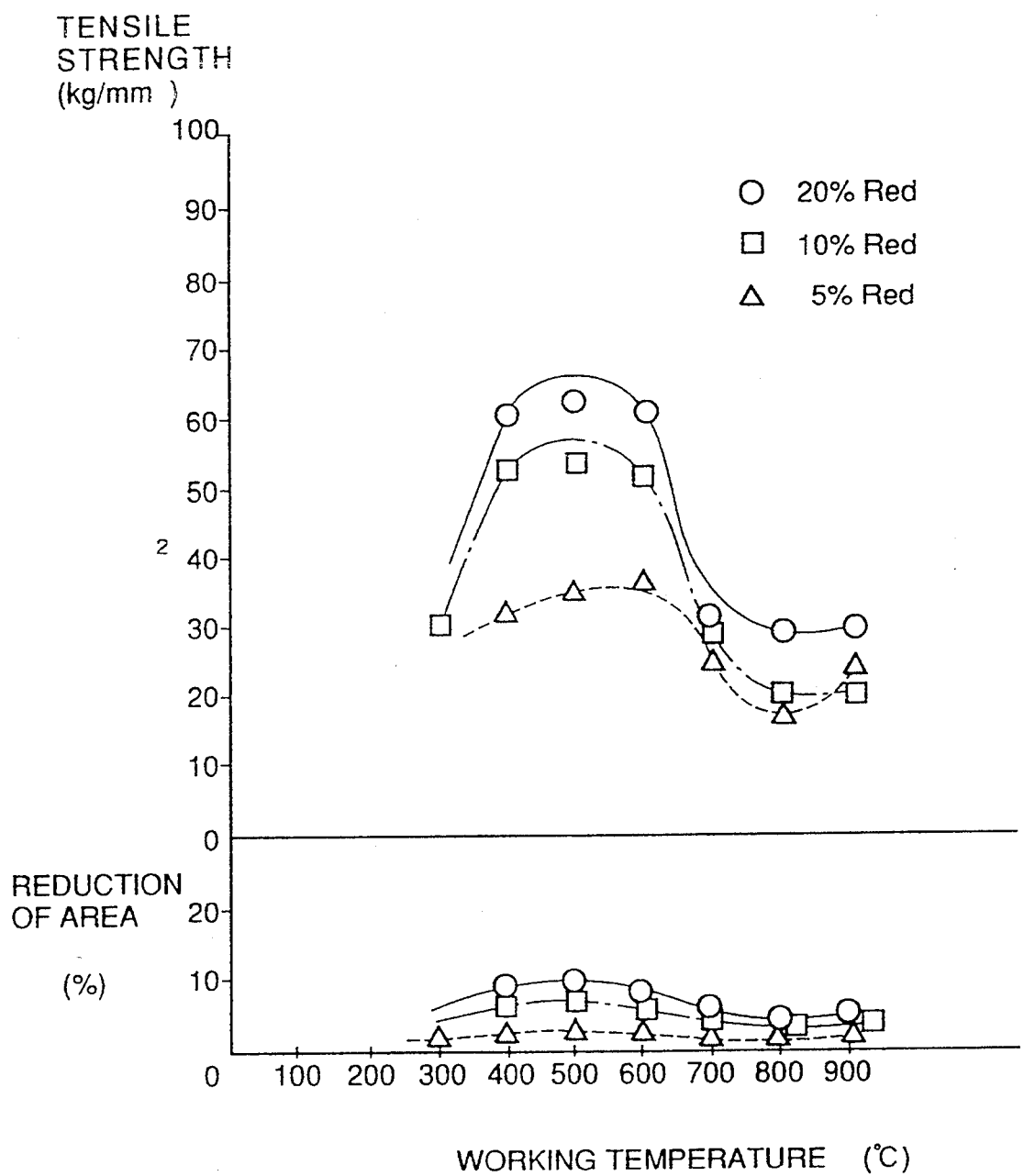
FIG. 17 is a graph showing relations between tensile strength, reduction of area and working temperatures in evaporation materials subjected to plastic working with materials fusion-casted in the atmosphere.

The results are shown in a graph of FIG. 17. As shown in FIG. 17, it is understood that those subjected to wire drawing of at least 10% in reduction in area at temperatures of 400° to 600° C. were extremely improved in both tensile strength and reduction of area.

EXAMPLE 17

Then, 80 kg of Co and 20 kg of Ni were fused and cast in a vacuum atmosphere, and ingots were prepared from 80 kg thereof. These were heated to a temperature of 1000° C., forged and rolled, to prepare rolled wires of 7 mmφ. These rolled wires were subjected to swaging of 5, 10 and 20% in reduction in area t temperatures of 100° to 900° C. to examine tensile strength and reduction of area of the long evaporation materials after the working. The results are shown in Table 13 and a graph of FIG. 18. Referring to Table 13, ○ indicates workable samples and X indicates those impossible to work.

TABLE 13

| Working Temperature (°C.) | Working ratio (%) | Tensile Strength (kg/mm²) | Reduction of Area (%) | Later Cold Wire Drawing (Reduction in Area: 15%) |
|---|---|---|---|---|
| 100 | 5-20 | Impossible to work due to occurrence of cracking | | |
| 300 | 5 | 45 | 1 | X |
|  | 10, 20%: Impossible to work | | | |
| 400 | 5 | 43 | 2 | X |
| 400 | 10 | 72 | 10 | ○ |
| 400 | 20 | 78 | 13 | ○ |
| 500 | 5 | 51 | 3 | X |
| 500 | 10 | 79 | 14 | ○ |
| 500 | 20 | 87 | 15 | ○ |
| 600 | 5 | 48 | 4 | X |
| 600 | 10 | 75 | 12 | ○ |
| 600 | 20 | 79 | 14 | ○ |
| 700 | 5 | 51 | 2 | X |
| 700 | 10 | 53 | 3 | X |
| 700 | 20 | 53 | 3.5 | X |
| 800 | 5 | 47 | 1.5 | X |
| 800 | 10 | 45 | 1 | X |
| 800 | 20 | 46 | 1.5 | X |
| 900 | 5 | 43 | 0.5 | X |
| 900 | 10 | 47 | 1 | X |
| 900 | 20 | 41 | 1 | X |
| No Working (As Rolling) | | 42 | 1 | X |

Figure 18:
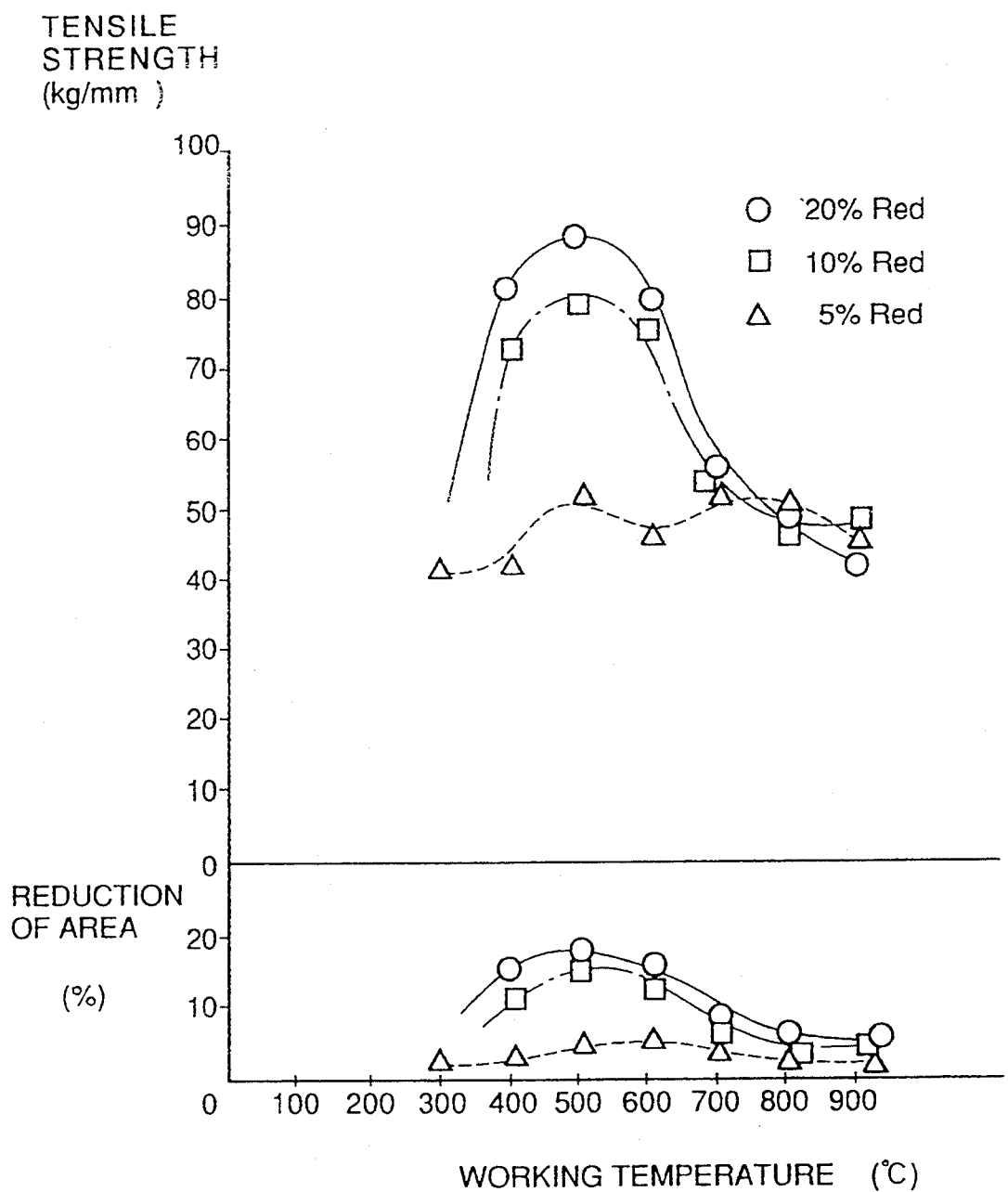
FIG. 18 is a graph showing relations between tensile strength, reduction of area and working temperatures in evaporation materials subjected to plastic working with materials fusion-casted in a vacuum.

As shown in Table 13 and FIG. 18, it is understood that those subjected to wire drawing of at least 10% at temperatures of 400° to 600° C. were extremely improved in both of tensile strength ad reduction of area. There is recognized such a tendency that tensile strength and reduction of area are improved as the draft is increased, and improvement of these properties is also recognized at a working ratio of 5%. It is understood that samples of this Example which were subjected to vacuum fusion casting exhibited further superior values as compared with the aforementioned Example 16.

Thus, wire drawing into a target wire diameter or drawing (shaving) with a barking die is facilitated as to a material which is improved in toughness in a later step, whereby it is possible to obtain a long wire having no surface impurities.

Further, a wire having excellent evaluation in the aforementioned working was fed to an evaporation unit in practice. The evaporation unit shown in FIG. 1 was employed.

As the result, it was confirmed possible to continuously feed the wire with no occurrence of breakage or the like during feeding of the wire. While a wire which was rolled at a temperature of 1000° C. was also fed for the purpose of comparison, it was difficult to continuously feed this wire due to frequent breakage.

EXAMPLE 18

The rolled materials of 7 mm$\phi$ according to Example 17 were subjected to plastic working of 15% in reduction in area at a temperature of 500° C. The plastic working methods were swaging, rolling and wire drawing, and tensile strength and reduction of area were examined as to these wires after the working. The results are shown in Table 14.

TABLE 14

| | Before Working | Swaging | Rolling | Wire Drawing |
|---|---|---|---|---|
| Tensile Strength (kg/mm$^2$) | 42 | 83 | 86 | 81 |
| Reduction of Area (%) | 1 | 14 | 16 | 13 |

As shown in Table 14, it was confirmed that improvement in tensile strength and reduction of area was observed according to any working method.

EXAMPLE 19

First, a Co alloy containing 20 weight % of Cr was prepared by 100 kg in a vacuum fusion furnace. This Co alloy was subjected to hot working, to prepare wires having diameters of 15, 12, 10, 8, 6, 4, 2, 1, 0.8 and 0.5 mm and lengths of at least 1000 times the respective diameters. These were fed to a crucible in a vacuum chamber of an evaporation unit in practice.

As the result, the wires having diameters of 15 mm and 12 mm were inferior in workability since the same were too large and extremely had to handle, while it was impossible to stably feed the wires having diameters of 0.8 and 0.5 mm since the same were bent in feeding, although the same were easy to handle. On the other hand, it was possible to stably feed the wires of other diameters.

EXAMPLE 20

Figure 19:
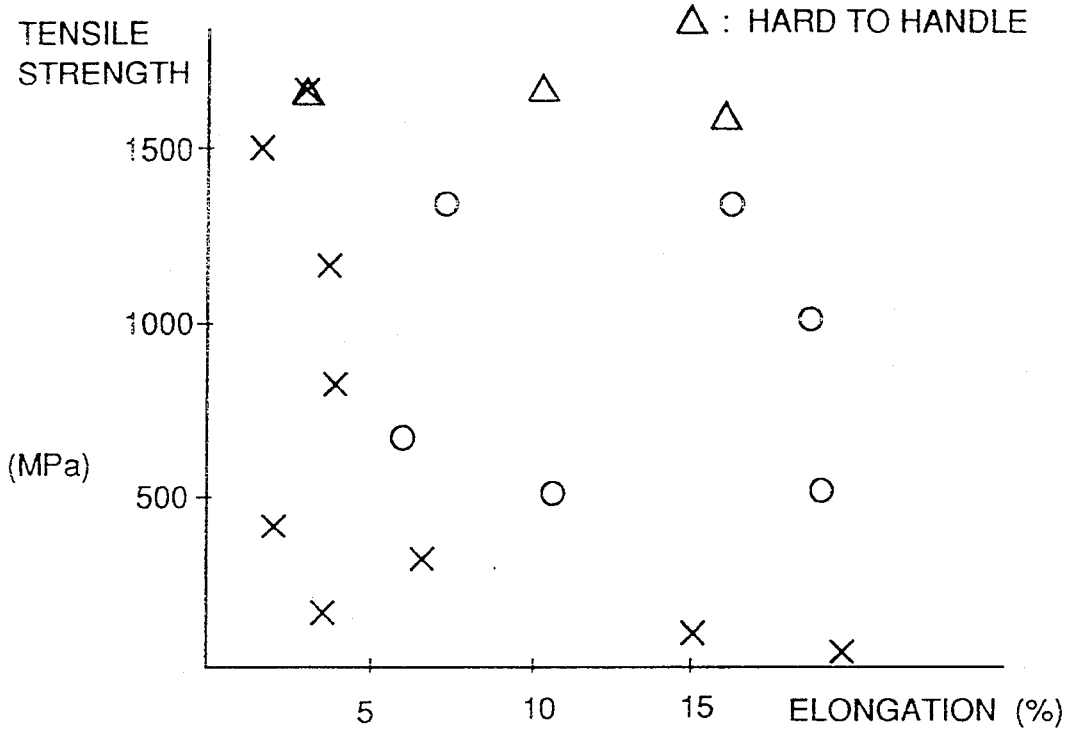
FIG. 19 is a graph showing relations between elongation and tensile strength as test results of mechanical properties of evaporation materials.
Figure 20:
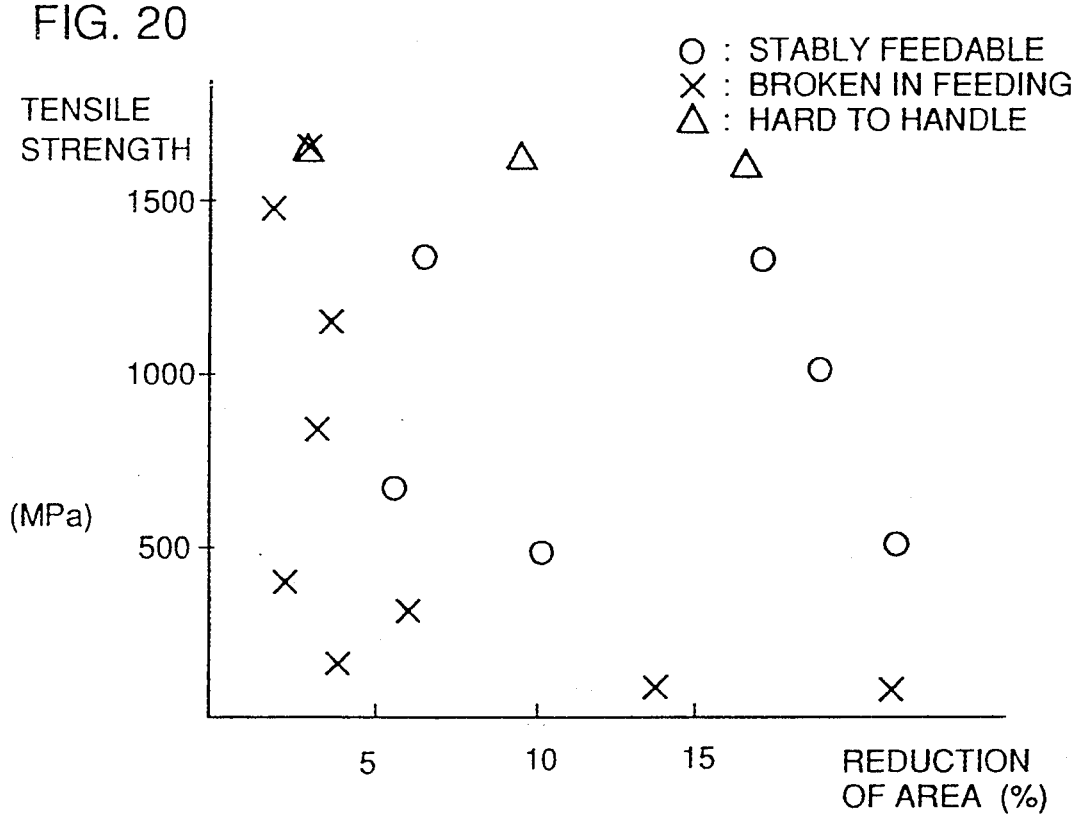
FIG. 20 is a graph showing relations between reduction of area and tensile strength as test results of mechanical properties of the evaporation materials.

Then, a Co alloy containing 20 weight % of Cr was prepared by 100 kg in a vacuum fusion furnace similarly to Example 19, and subjected to hot working to prepare wires of 5 mm in diameter. At this time, working conditions and heat treatment conditions were adjusted to obtain wires having various mechanical properties (tensile strength, elongation and reduction of area), and subjected to a feeding test similarly to Example 19. The results are shown in FIGS. 19 and 20. As shown in FIGS. 19 and 20, those having tensile strength of less than 500 MPa were insufficient in strength an caused Wire breaking. On the other hand, the wires having tensile strength values exceeding 1500 MPa were so hard that it was difficult to handle and feed the same.

Unless elongation (FIG. 19) and reduction of area (FIG. 20) were at least 5% respectively, further, it was impossible to stably feed the wires due to breakage caused during feeding of the wires etc.

EXAMPLE 21

Further, wires similar to those of Example 20 were prepared and surfaces thereof were mechanically ground and further washed with an organic solvent. Impurities on the surfaces of the respective wires were analyzed before the grinding, after the grinding and after the washing, with an energy dispersive X-ray analyzer system (EDS).

As the result, large quantities of impurities such as oxides were analyzed on the surfaces of the wires before the grinding. Further, lubricants in the grinding etc. were analyzed in the wires after the grinding. On the other hand, absolutely no surface deposits were analyzed as to the wires after the washing with the organic solvent.

EXAMPLE 22

Figure 21:
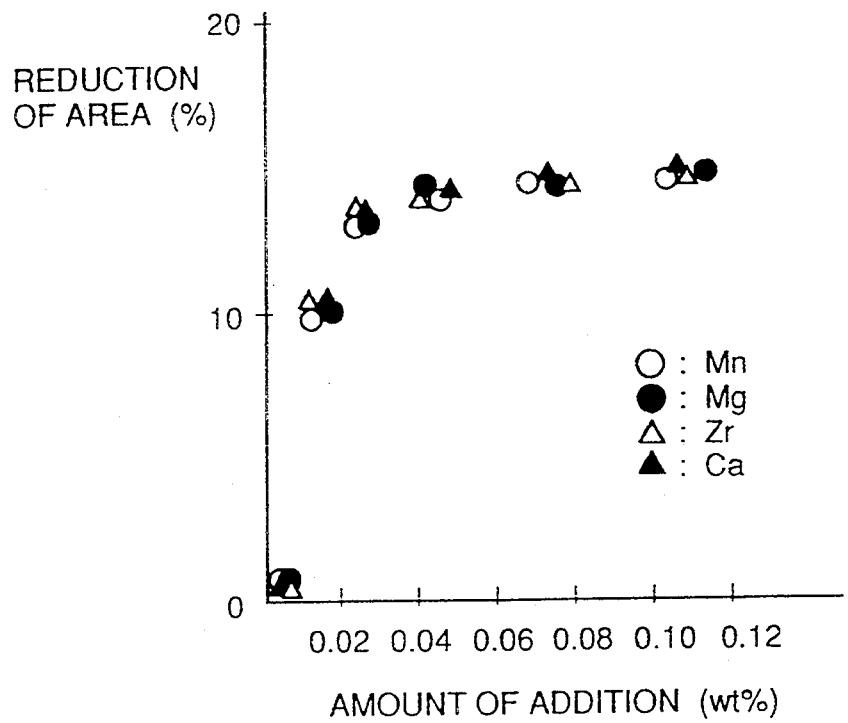
FIG. 21 is a graph showing relations between reduction of area and amounts of additional elements in a tensile test of Co—Cr alloys containing different additional elements.

Materials prepared by adding Mn, Mg, Zr and Ca to Co alloys containing 20 weigh % of Cr were employed to make a tensile test at room temperature, for evaluating reduction of area. Relations between amounts of the respective additional elements and the reduction of area are shown in FIG. 21. Referring to FIG. 21, marks ○ indicate Mn, marks indicate Mg, marks Δ indicate Zr, and marks indicate Ca.

As clearly understood from FIG. 21, it was confirmed possible to improve reduction of area and to improve workability by adding at least 0.01 weight % of any element.

EXAMPLE 23

Figure 22:
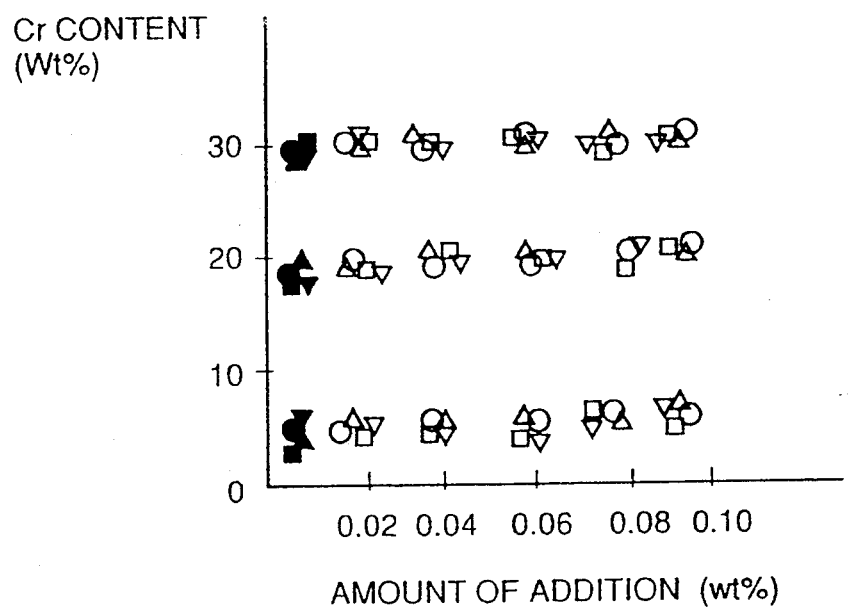
FIG. 22 is a graph showing relations between reduction of area and amounts of additional elements in Co—Cr alloys having different Cr contents.

A test similar to that of Example 22 was made also on Co alloys containing 5 weight %, 20 weight % and 30 weight % of Cr. The results are shown in FIG. 22. Referring to the figure, circles indicate Mn, triangles indicate Mg, inverted triangles indicated Zr and squares indicate Ca, while white or non-tilled marks indicate reduction of area of at least 10 % and black marks indicate reduction of area of less than 10%.

Also in the case of this Example, alloys to which at least 0.01 weight % of respective elements were added exhibited reduction of area of at least 10%, to show excellent workability.

EXAMPLE 24

Figure 23:
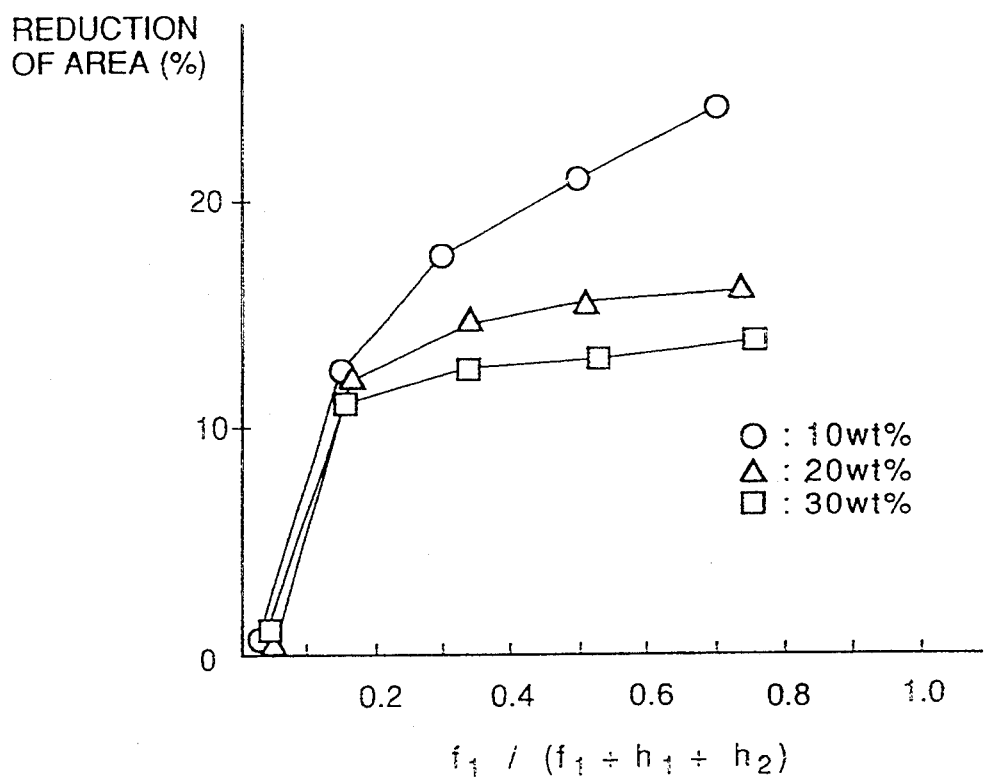
FIG. 23 is a graph showing relations between reduction of area and value of $f1/(f1+h1+h2)$ as fcc ratios in Co—Cr alloys having different Cr contents.

Co alloys containing 10 weight %, 20 weight % and 30 weight % of Cr were subjected to evaluation of reduction of area by a tensile test a the room temperature while varying values of f1/(f1+h1+h2) with difference of working conditions. Symbols f1, h1 and h2 represent diffraction peak intensity values (cps) corresponding to a (200) plane of a face centered cubic lattice (fcc), a (100) plane of a close-packed hexagonal lattice (hcp) and a (101) plane of the close-packed hexagonal lattice (hcp) in X-ray diffraction respectively. The test results are shown in FIG. 23. Referring to the figure, marks ○ indicate 10 weight % Cr, marks Δ indicate 20 weight % Cr, and marks □ indicate 30 weight % Cr.

As clearly understood from FIG. 23, it was confirmed that excellent workability was attained with reduction of area of at least 10% in any case of the Cr content by controlling the value of f1/(f1+h1+h2) to be at least 0.1 and not more than 1.0.

EXAMPLE 25

Figure 24:
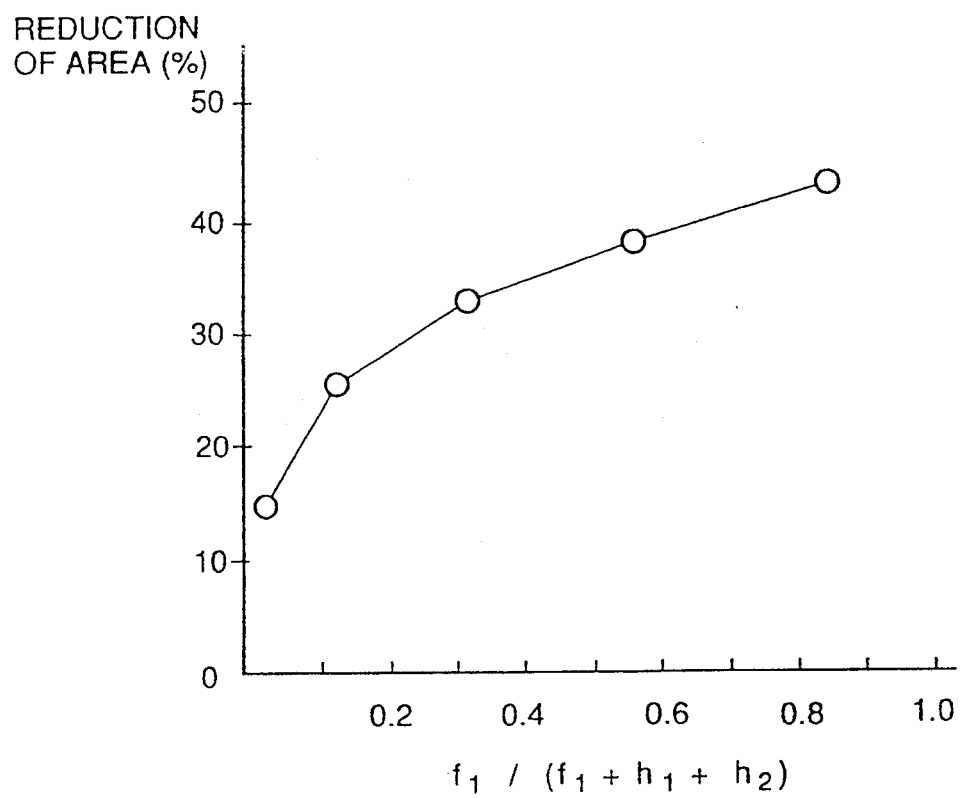
FIG. 24 is a graph showing relations between reduction of area and fcc ratios in Co—Cr alloys containing Mn as an additional element and controlling $f1/(f1+h1+h2)$ as fcc ratios.

Materials prepared by adding 0.03 weight % of Mn to Co alloys containing 20 weight % of Cr were subjected to evaluation of reduction of area similarly to Example 24, while varying values of f1/(f1+h1+h2) with difference of working conditions. The results are shown in FIG. 24. As clearly understood from the figure, it was confirmed possible to further improve the reduction of area not only by controlling the value of f1/(f1+h1+h2) but adding a prescribed amount of Mn.

EXAMPLE 26

Figure 25:
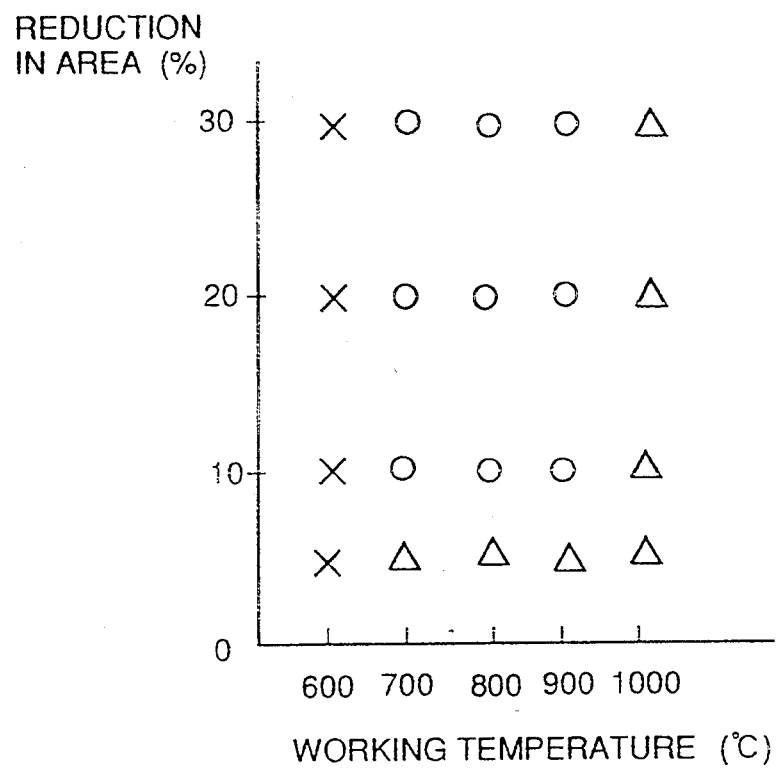
FIG. 25 is a graph showing working conditions (working temperatures and reduction in area) and reduction of area in Co—Cr alloys containing 10 weight % of Cr.
Figure 26:
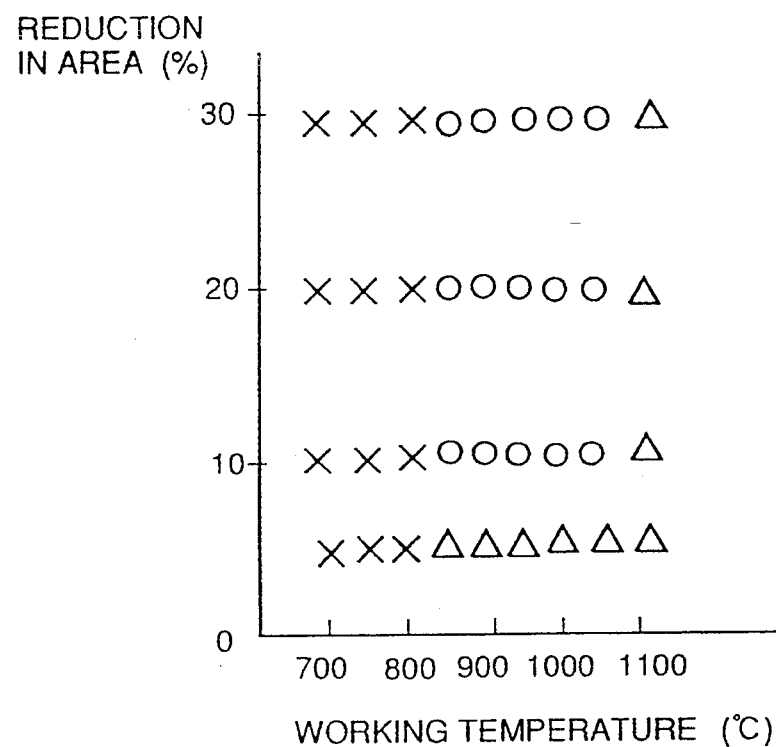
FIG. 26 is a graph showing working conditions (working temperatures and reduction in area) and reduction of area in Co—Cr alloys containing 20 weight % of Cr.
Figure 27:
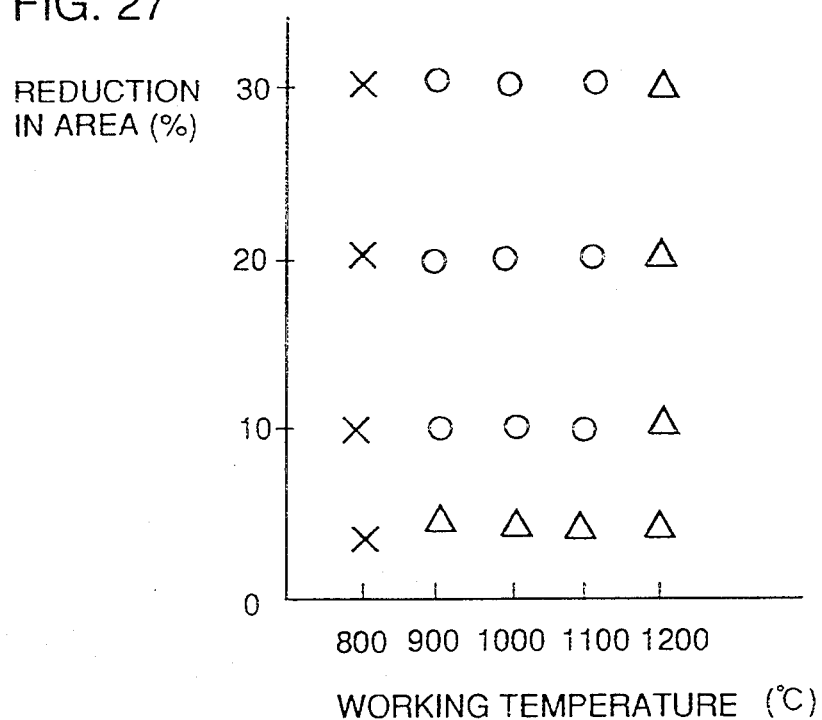
FIG. 27 is a graph showing working conditions (working temperatures and reduction in area) and reduction of area in Co—Cr alloys containing 30 weight % of Cr.

Co alloys containing 10 weight %, 20 weight % and 30 weight % of Cr were subjected to working of different conditions (working temperature and reduction in area), cooled at a speed of 1° C./sec., and subjected to a tensile test at room temperature, for evaluation of reduction of area. Transformation temperatures of the Co-10 weight % Cr alloy, the Co-20 weight % Cr alloy and the Co-30 weight % Cr alloy were about 700° C., 850° C. and 900° C. respectively. The respective test results are shown in FIGS. 25 to 27. Referring to the respective figures, marks ○ indicate reduction of area of at least 10%, marks Δ indicate reduction of area of less than 10%, and marks X indicate that working was impossible.

As clearly understood from the figures, improvement in reduction of area was recognized when working of reduction in area of at least 10% was performed at a temperature of at least Tt and not more than Tt+200° C., assuming that Tt (=Tu=Td) represents the transformation temperature.

EXAMPLE 27

Figure 28:
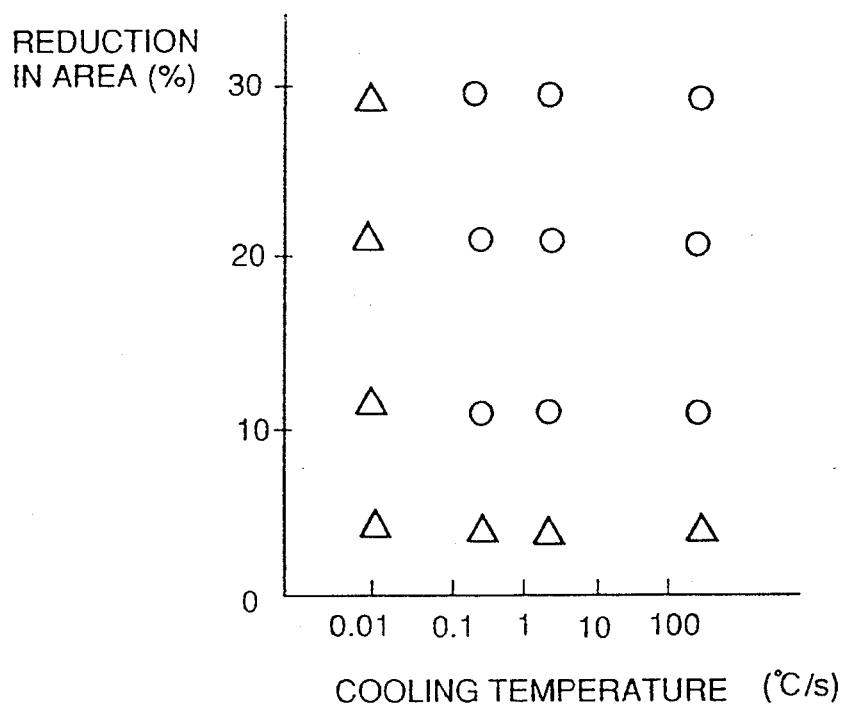
FIG. 28 is a graph showing differences between values of reduction of area in Co- 20 wt. % Cr alloys in a case of performing working with different values of reduction in area and also changing subsequent cooling rates.

Further, materials obtained by performing working on Co alloys containing 20 weight % of Cr at a temperature of 900° C. at different values of reduction in area while also varying cooling rates after the working were subjected to a tensile test at room temperature, for evaluation of reduction of area. The results are shown in FIG. 28. Referring to the figure, marks ○ indicate reduction of area of at least 10%, and marks Δ indicate reduction of area of less than 10%. As clearly understood from the figure, it was confirmed that, even if working of at least 10% in reduction in area was performed at the temperature of 900° C., a later cold tensile property (reduction of area) was low and workability was not sufficient when the cooling rate after the working was less than 0.1° C./sec.

EXAMPLE 28

First, a raw material containing 80 weight % of Co and 20 weight % of Ni was fused and cast in a vacuum fusion furnace, to prepare ingots. These ingots were heated to a temperature 1100° C., forged and thereafter rolled at the same temperature to prepare wires of about 10 mm$\phi$ by 200 kg. Correctly measured diameters of the rolled wires were 10.20 to 10.50 mm$\phi$. These wires were annealed, thereafter wire-drawn to 10.00 mm$\phi$ in a cold state, and further shaved with a barking die to be 9.8 mm$\phi$. Thereafter the wires were steam-washed with trichlene, whereby impurities adhering in rolling and lubricants adhering in shaving were hardly recognized on surfaces of the wires. Further, it was confirmed possible to obtain wires having good surface states with excellent diametral deviation of 0.01 mm.

EXAMPLE 29

Wires of 10 mm$\phi$ and 6 mm$\phi$ were prepared by rolling after carrying out the same preliminary steps as those of Example 28. These rolled wires were reduced in diameter with a perforated die for wire drawing, and subjected to shaving with a perforated die for barking in continuation thereto. Correct wire diameters of the rolled wires before the working were 10.20 to 10.50 mm in 10 mm$\phi$ materials, and 5.98 to 6.13 mm in 6 mm$\phi$ materials.

Figure 29:
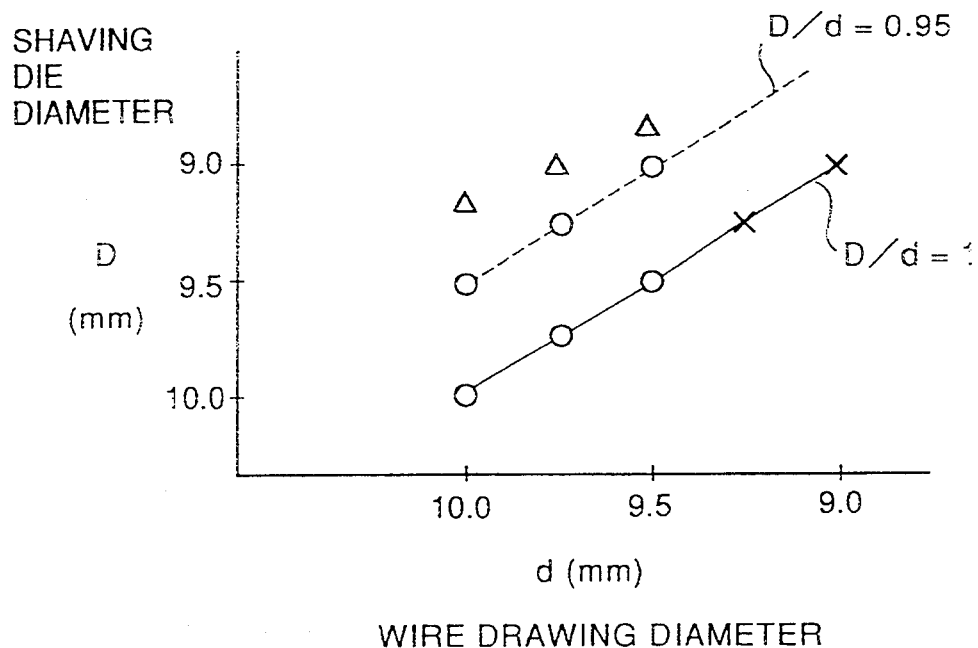
FIG. 29 is a graph showing relations between wire drawing die diameters d and barking die diameters D in a case of performing shaving in continuation to wire drawing, illustrating results in a case of employing wires of 10 mm in diameter.
Figure 30:
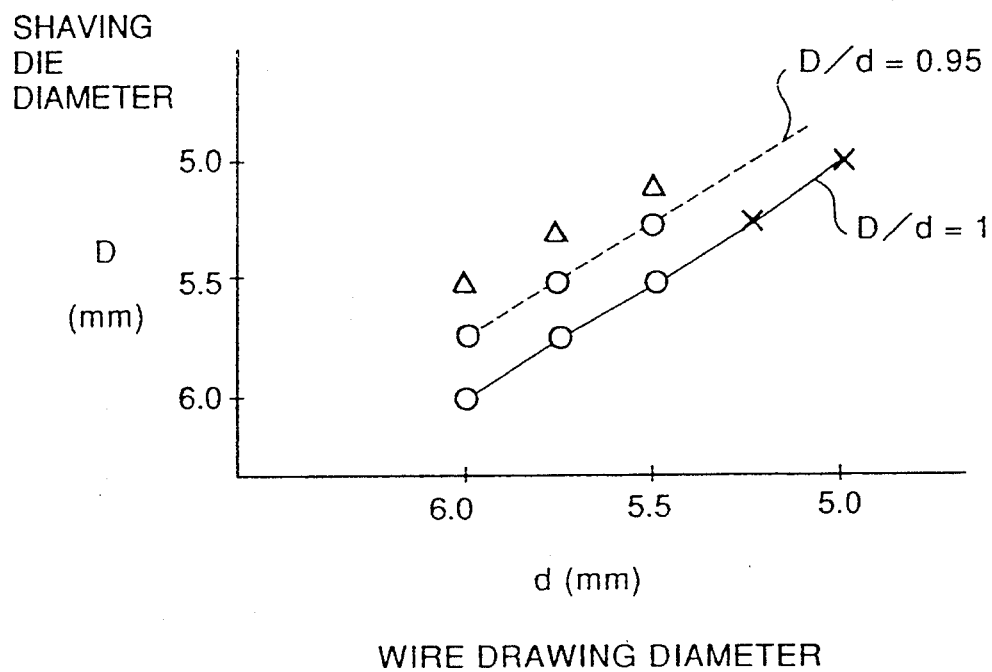
FIG. 30 is a graph showing relations between wire drawing die diameters d and barking die diameters D in a case of performing shaving in continuation to wire drawing, illustrating results in a case of employing wires of 6 mm in diameter.

The results of the aforementioned shaving are shown in FIGS. 29 and 30. FIG. 29 shows the results as to the wires of 10 mm$\phi$, and FIG. 30 shows the results as to the wires of 6 mm$\phi$. The axis of ordinates of each graph shows the barking die diameter D, and the axis of abscissas shows the wire drawing die diameter d. Referring to each figure, marks ○ indicate that the wires were excellent, marks Δ indicate that the wires allowed wire drawing but were broken in shaving, and marks X indicate that the wires were broken in wire drawing. As clearly understood from the figures, it was confirmed that excellent results were obtained when D/d was within a range of 0.95 to 1.0 among the wires allowing wire drawing.

EXAMPLE 30

Wires having wire diameters of 10.00 mm and 6.00 mm after rolling and wire drawing were prepared and subjected to shaving at different amounts of barking with perforated dies for barking, to examine workability thereof. The results are shown in Table 15.

TABLE 15

| Diameter Before Shaving (mm) | Diameter After Shaving (mm) | Result |
| --- | --- | --- |
| 10.00 | 9.95 (0.5/100) | No unshaved portion, with chatter |
| 10.00 | 9.9 (1/100) | Excellent |
| 10.00 | 9.8 (2/100) | Excellent |
| 10.00 | 9.5 (5/100) | Excellent |
| 10.00 | 9.3 (7/100) | Broken in several meters |
| 10.00 | 9.0 (10/100) | Broken at once |
| 6.00 | 5.93 (0.5/100) | Unshaved portion left |
| 6.00 | 5.94 (1/100) | Excellent |
| 6.00 | 5.88 (2/100) | Excellent |
| 6.00 | 5.7 (5/100) | Excellent |
| 6.00 | 5.4 (10/100) | Broken in several meters |

As shown in Table 15, chatters were recognized on the mm material in addition to an unshaved portion while an unshaved portion was also recognized on the 6 mm$\phi$ material when the amounts of barking (amounts of shaving grinding/wire diameter before working) were 0.5/100. When the amounts of barking exceeded 5/100, on the other hand, wire breaking was caused in all samples. However, no unshaved portions were observed and excellent results were obtained when the amounts o f barking were between 1/100 and 5/100

Figure 31:
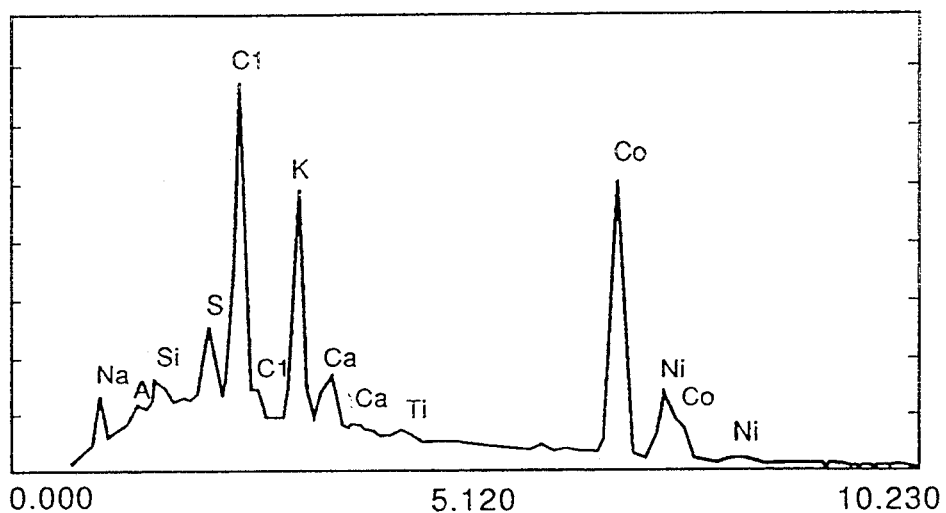
FIG. 31 is a diagram showing a result of analysis of presence/absence of surface impurities with a scanning electron microscope (SEM) a to a wire prepared by the inventive method

Further, wires having wire diameters of 10.00 mm$\phi$ and 5.00 mm$\phi$ after wire drawing were prepared and these were subjected to shaving at different amounts of barking with a perforated die for barking, to analyze surface impurities thereof. The analyzing method was carried out with an analytical scanning electron microscope (SEM) with respect to areas of 0.2 mm by 0.2 mm on the wire surfaces. An analysis chart thereof as shown in FIG. 31. Further, evaluation results for the respective amounts of barking are shown in Table 16. The evaluation was on the basis of peak heights of Co in the analysis chart, and peak heights of other impurities with respect to the same are shown in ratios.

TABLE 16

| Amount of Barking | Impurity Peak Ratio | |
| --- | --- | --- |
| Diameter × 1/200 | Si, Ca | 0.3 |
| Diameter × 1/100 | Si | 0.03 |
| Diameter × 3/100 | | No |
| Diameter × 5/100 | | No |
| Diameter × 7/100 | | No |
| Diameter × 0/100 | Large Amounts of Cl, K, Ca | 0.1–1 |

As shown in Table 16, it was confirmed that excellent results were obtained if the amounts of barking were at least 1/100 with respect to the diameters of the wires.

EXAMPLE 31

Figure 32:
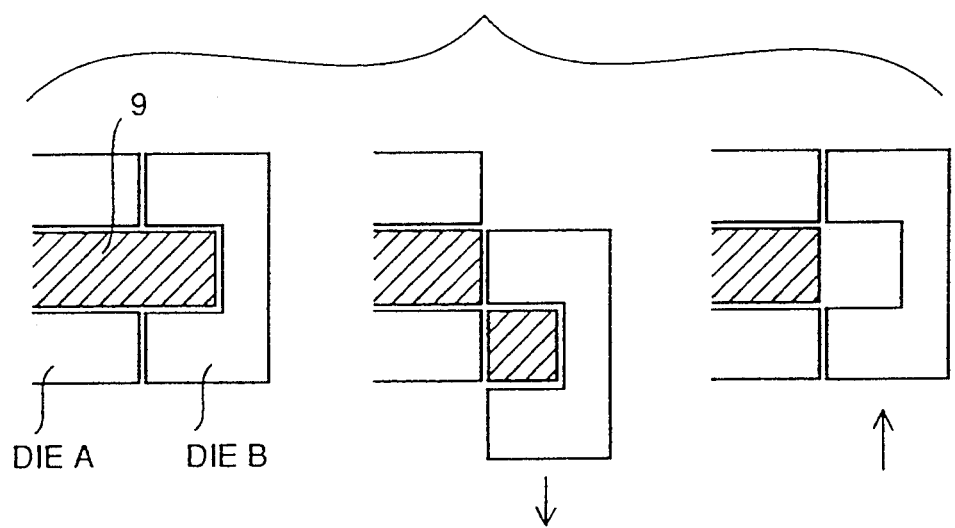
FIG. 32 is a sectional view showing a die assembly for cutting a long member which is employed in the inventive method.
Figure 33:
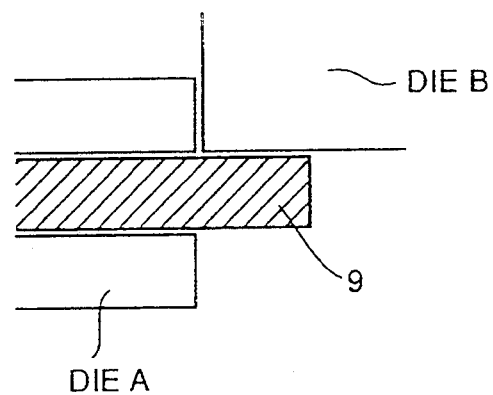
FIG. 33 is a sectional view of a die assembly which is employed for manufacturing a conventional pellet.

FIG. 33 Rolled wires of 10.0 mm in diameter (correctly 10.2 to 10.5 mm) obtained through similar steps as those of Example 28 and wires (shaved materials) of 9.8 mm in diameter obtained by further carrying out wire drawing and shaving were cut with a die assembly shown in FIG. 32, to prepare pellets. This die assembly is formed by a die A having a hole for receiving wires and a die B, which is opposed thereto, having a concave section as shown in FIG. 32. Preparation of each pellet is performed by inserting a wire 9 in the hole of the die A to project the wire 9 from its opening portion, downwardly moving the die B with respect to the die A as shown by arrow so that the wire is sheared, and cutting the as-projected wire portion.

Then, clearances between the hole of the metal mold and the wires, cutting properties, and diametral deviation values (differences between maximum and minimum diameters of pellet sections) of the as-obtained pellets were examined. The results are shown in Table 17.

tion is not more than 0.5 mm. As shown in Table 17, all rolled wires had large diametral deviation from before cutting, such that the wires clogged the metal molds if the clearances were less than 0.05 mm, while those having small diametral deviation could be obtained in excess of that. In the case of the shaved materials, on the other hand, the wire having a clearance of 0.03 mm clogged the dies although the same had small diametral deviation, while that having a clearance of 0.75 mm had large diametral deviation. However, excellent results were obtained in all of the remaining ones.

It is possible to remove surface impurities by further performing barrel polishing or the like on a short material (pellet) or to arrange its shape by grinding and rounding corner portions, to obtain a pellet which is further excellent in surface state and in shape.

As hereinabove described, effective use is expected for the evaporation material obtained according to the present invention in the field of manufacturing of a VTR tape, a vertical magnetic recording thin film and the like.

Although the invention has been described with reference to specific example embodiments, it will be appreciated that it is intended to cover all modifications and equivalents within the scope of the appended claims.

We claim:

1. A method of preparing an evaporation material in the form of a wire having a wire diameter of at least 1.0 mm and not more than 10 mm, and being prepared from one metal material selected from the group consisting of a cobalt metal consisting of cobalt and unavoidable impurities, a cobalt-nickel alloy containing cobalt and not more than 30 weight % of nickel with a rest consisting of unavoidable impurities, and a cobalt-chromium alloy containing cobalt and not more than 30 weight % of chromium with a rest consisting of unavoidable im-

TABLE 17

| Test Material | Cutting Die Diameter (mm) | Diameter of Short Member After Cutting (mm) | | Evaluations |
| --- | --- | --- | --- | --- |
| Shaved Material (9.8 mm) | 9.83 (0.03) | Max 9.83 | Min 9.76 | Δ |
| Shaved Material (9.8 mm) | 9.85 (0.05) | Max 9.85 | Min 9.72 | ○ |
| Shaved Material (9.8 mm) | 9.9 (0.1) | Max 9.89 | Min 9.70 | ○ |
| Shaved Material (9.8 mm) | 10.05 (0.25) | Max 10.03 | Min 9.68 | ○ |
| Shaved Material (9.8 mm) | 10.25 (0.5) | Max 10.13 | Min 9.63 | ○ |
| Shaved Material (9.8 mm) | 10.5 (0.75) | Max 10.35 | Min 9.55 | X |
| Rolled Material (10.2–10.5 mm) | 10.53 (0.03) | Max 10.53 | Min 10.02 | ○ |
| Rolled Material (10.2–10.5 mm) | 10.55 (0.05) | Max 10.55 | Min 9.61 | X |
| Rolled Material (10.2–10.5 mm) | 10.6 (0.1) | Max 10.56 | Min 9.47 | X |
| Rolled Material (10.2–10.5 mm) | 10.75 (0.25) | Max 10.70 | Min 9.38 | X |
| Rolled Material (10.2–10.5 mm) | 11.0 (0.5) | Max 10.83 | Min 9.26 | X |

○: diametral deviation of not more than 0.5 mm, with no particular problem
Δ: diametral deviation of not more than 0.5 mm, but with wires clogging metal molds in cutting
X: diametral deviation exceeding 0.5 mm
Numerals in ( ) indicate maximum differences between wire diameters and cutting die (metal mold hole) diameters When a pellet is fed to an evaporation unit through a pipe, diametral deviation is preferably not more than 0.5 mm in general. Referring to Table 17, evaluation is made depending on whether or no the diametral deviapurities, said method of preparing the evaporation material comprising the steps of: preparing a metal material for forming said wire by fusion casting; and heating said metal material to a temperature of at least Tu°C. and thereafter performing plastic working of reduction in area of at least 10% in a single pass at a temperature of at least Td°C. and not more than (Tu+200)°C. wherein Tu°C. is a transformation temperature from a close-packed hexagonal lattice to a face centered cubic lattice as a crystal structure of said metal material in a temperature rise process and Td°C. is a transformation temperature from said face centered cubic lattice to said close-packed hexagonal lattice in a temperature reduction process, thereby obtaining a wire.

2. The method of preparing an evaporation material in accordance with claim 1, wherein said plastic working is performed in a cooling process.

3. The method of preparing an evaporation material in accordance with claim 1, wherein said plastic working is performed in a state maintaining a heating temperature.

4. The method of preparing an evaporation material in accordance with claim 1, further comprising a step of cooling said wire at a temperature reduction rate of at least 0.1° C./sec. after performing said plastic working.

5. The method of preparing an evaporation material in accordance with claim 1, wherein said plastic working is any single working selected from the group consisting of swaging, rolling and drawing.

6. A method of preparing an evaporation material in the form of a wire having a wire diameter of at least 1.0 mm and not more than 10 mm, and being prepared from one metal material selected from the group consisting of a cobalt metal consisting of cobalt and unavoidable impurities, a cobalt-nickel alloy containing cobalt and not more than 30 weight % of nickel with a rest consisting of unavoidable impurities, and a cobalt-chromium alloy containing cobalt and not more than 30 weight % of chromium with a rest consisting of unavoidable impurities, said method of preparing the evaporation material comprising the steps of: preparing a metal material for forming said wire by fusion casting; heating said metal material to a temperature of at least Tu°C. and thereafter performing plastic working of reduction in area of at least 10% in a single pass at a temperature of at least Td°C. and not more than (Tu+200)°C. wherein Tu°C. is a transformation temperature from a close-packed hexagonal lattice to a face centered cubic lattice as a crystal structure of said metal material in a temperature rise process and Td°C. is a transformation temperature from said face centered cubic lattice to said close-packed hexagonal lattice in a temperature reduction process, thereby obtaining a wire; and reducing deviation with respect to a diameter to not more than 1/100 by wire drawing, and performing shaving of at least 1/100 and not more than 5/100 of said diameter on said wire.

7. The method of preparing an evaporation material in accordance with claim 6, wherein said shaving is performed by extracting said wire with a perforated die for barking.

* * * * *

UNITED STATES PATENT AND TRADEMARK OFFICE
CERTIFICATE OF CORRECTION

PATENT NO. : 5,441,010
DATED : August 15, 1995
INVENTOR(S) : Oishi et al.

It is certified that error appears in the above-indentified patent and that said Letters Patent is hereby corrected as shown below:

ON THE TITLE PAGE:

In [22] PCT Filed: "May 6, 1994" should be --May 6, 1993--.

In [57] ABSTRACT line 13, after "1." insert the following --It is possible to obtain a wire having the above properties by heating the metal material to at least Tu°C and thereafter performing plastic working of reduction in area of at least 10 % in a single pass at a temperature of at least Td°C and not more than (Tu + 200)°C. Preferably, the cobalt metal or the cobalt-nickel alloy further contains 0.01 to 0.1 weight % of Mn, Cr, Mg, Zr or Ca. Preferably, the cobalt-chromium alloy further contains 0.01 to 0.1 weight % of Mn, Mg, Zr or Ca.--.

On Sheet 11 of the drawings, the vertical axis should be labeled --WORKING TEMPERATURE--, delete "WORKING SPEED".

On Sheet 18 of the drawings, Fig. 28, the horizontal axis should be labelled --COOLING RATE (°C/s)--, delete "COOLING TEMPERATURE (°C/s)".

UNITED STATES PATENT AND TRADEMARK OFFICE
CERTIFICATE OF CORRECTION

PATENT NO. : 5,441,010
DATED : August 15, 1995
INVENTOR(S) : Oishi et al.

It is certified that error appears in the above-indentified patent and that said Letters Patent is hereby corrected as shown below:

```
Col. 1, line 33, after "unit" insert --.--.
Col. 2, line 36, replace "along" by --a long--.
Col. 3, line  1, replace "Wile" by --While--.
Col. 4, line 24, replace "lux" by --flux--.
Col. 5, line  5, after "of" (second occurrence) insert --a--.
Col. 6, line 11, replace "he" by --the--;
        line 36, replace "highquality" by --high-quality--;
        line 57, replace "ion" by --on--.
Col. 8, line  1, replace "ah" by --an--;
        line 21, after "work" insert --a--;
        line 53, after "that" insert --d--;
        line 64, after "wire" insert --are--.
Col. 9, line 18, replace "On" by --On--;
        line 62, replace "s" by --is--.
```

UNITED STATES PATENT AND TRADEMARK OFFICE
CERTIFICATE OF CORRECTION

PATENT NO. : 5,441,010
DATED : August 15, 1995
INVENTOR(S) : Oishi et al.

It is certified that error appears in the above-indentified patent and that said Letters Patent is hereby corrected as shown below:

Col. 10, line 1, replace "d" by --$\underline{d}$--, replace "de" by --die--;
 line 3, replace "preparing/a" by --preparing a--;
 line 18, replace "0.5." by --0.5 mm.--.
Col. 12, line 2, replace "d" by --$\underline{d}$--;
 line 7, replace "d" by --$\underline{d}$--;
 line 40, replace "Trr" by --Torr--.
Col. 13, line 49, delete "(FIG. 4)".
Col. 14, line 3, replace "wire is" by --wires--;
 line 7, replace "wired" by --wire feed--;
 line 53, after "are" insert --at--.
Col. 17, line 54, replace "he" by --the--.
Table 4, 7th column heading, line 2, replace "Structrue" by --Structure--.
Col. 19, line 47, replace "1010B" by --1000B--.

UNITED STATES PATENT AND TRADEMARK OFFICE
CERTIFICATE OF CORRECTION

PATENT NO.  : 5,441,010
DATED       : August 15, 1995
INVENTOR(S) : Oishi et al.

It is certified that error appears in the above-identified patent and that said Letters Patent is hereby corrected as shown below:

Col. 21, line 38, replace "B (T)." by --Br (T).--;
        line 42, replace "of" (second occurrence) by --or--.

Col. 22, line 40, replace "System" by --system--;
        line 50, replace "he" by --the--.

Col. 24, line 12, delete "of";
        line 14, replace "Of" by --of--.

Col. 25, line 12, replace "leas" by --least--.

Table 11, under the heading "Reduction in Area (%)",
        line 4, replace "403" by --40.3--;
        line 8, replace "403" by --40.3--.

Col. 28, line 22, replace "t" by --at--;
        line 58, replace "ad" by --and--.

Col. 29, line 45, replace "had" by --hard--;
        line 63, replace "an" by --and--;
        line 64, replace "Wire" by --wire--.

UNITED STATES PATENT AND TRADEMARK OFFICE
CERTIFICATE OF CORRECTION

PATENT NO. : 5,441,010
DATED : August 15, 1995
INVENTOR(S) : Oishi et al.

It is certified that error appears in the above-indentified patent and that said Letters Patent is hereby corrected as shown below:

Col. 30, line 23, replace "weigh" by --weight--;

line 28, after "marks" (first occurrence) insert --●--;

line 29, after "marks" insert --▲--;

line 41, replace "non-tilled" by --non-filled--;

line 53, replace "a" (second occurrence) by --at--.

Col. 32, line 17, replace "d" by --$\underline{d}$--;

Following Table 15, and above line 49, insert the following:

--( ): (amount of shaving grinding/wire diameter before working) ratio--;

Col. 32, line 50, replace "mm" by --10 mmφ--;

line 68, replace "The" by --This--.

Col. 33, line 18, delete "FIG. 33";

Table 17, under the heading "Evaluations",
line 7, replace "o" by --Δ--;

Col. 33, line 68, replace "no" by --not--.

UNITED STATES PATENT AND TRADEMARK OFFICE
CERTIFICATE OF CORRECTION

PATENT NO. : 5,441,010
DATED : August 15, 1995
INVENTOR(S) : Oishi et al.

It is certified that error appears in the above-indentified patent and that said Letters Patent is hereby corrected as shown below:

Col. 35, line 17, delete "in a state".

Signed and Sealed this

Twentieth Day of February, 1996

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO.  : 5,441,010
DATED       : Aug. 15, 1995
INVENTOR(S) : Oishi et al.

It is certified that error appears in the above-identified patent and that said Letters Patent is hereby corrected as shown below:

Column 12, line 37, replace "camber" by --chamber--;

Column 19, line 65, replace "110° C" by --1100° C--;

Column 19, Table 5, first column heading, replace "Terget Rolling-Temperature" by --Target Rolling-Temperature--.

Signed and Sealed this

Twenty-eighth Day of May, 1996

Attest:

BRUCE LEHMAN

Attesting Officer    Commissioner of Patents and Trademarks